United States Patent
Lee et al.

(10) Patent No.: US 11,959,001 B2
(45) Date of Patent: Apr. 16, 2024

(54) QUANTUM DOT COMPOSITION, LIGHT EMITTING ELEMENT, AND METHOD FOR MANUFACTURING THE SAME

(71) Applicant: Samsung Display Co., Ltd., Yongin-si (KR)

(72) Inventors: Changhee Lee, Seoul (KR); Sehun Kim, Yongin-si (KR); Hyojin Ko, Seoul (KR); Dukki Kim, Suwon-si (KR); Jaehoon Kim, Seoul (KR); Hyunmi Doh, Seoul (KR); Yunku Jung, Cheonan-si (KR); Jaekook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 387 days.

(21) Appl. No.: 17/212,630

(22) Filed: Mar. 25, 2021

(65) Prior Publication Data

US 2021/0371739 A1 Dec. 2, 2021

(30) Foreign Application Priority Data

Jun. 2, 2020 (KR) .................. 10-2020-0066732

(51) Int. Cl.
| | |
|---|---|
| *C09K 11/08* | (2006.01) |
| *C09K 11/06* | (2006.01) |
| *B82Y 20/00* | (2011.01) |
| *B82Y 30/00* | (2011.01) |
| *B82Y 40/00* | (2011.01) |
| *H10K 50/115* | (2023.01) |
| *H10K 50/15* | (2023.01) |

(Continued)

(52) U.S. Cl.
CPC .............. *C09K 11/08* (2013.01); *C09K 11/06* (2013.01); *B82Y 20/00* (2013.01); *B82Y 30/00* (2013.01); *B82Y 40/00* (2013.01); *H10K 50/115* (2023.02); *H10K 50/15* (2023.02); *H10K 50/16* (2023.02); *H10K 2102/00* (2023.02)

(58) Field of Classification Search
CPC ......... C09K 11/08; C09K 11/06; C09K 11/02; C09K 11/025; B82Y 20/00; B82Y 30/00; B82Y 40/00; H10K 50/115; H10K 50/15; H10K 50/16; H10K 2102/00; H10K 71/00; H10K 71/12; H10K 71/40
USPC ........................................................ 428/690
See application file for complete search history.

(56) References Cited

U.S. PATENT DOCUMENTS

| | | |
|---|---|---|
| 9,793,505 B2 | 10/2017 | Zhou et al. |
| 10,287,498 B2 | 5/2019 | Zhou et al. |

(Continued)

FOREIGN PATENT DOCUMENTS

| | | |
|---|---|---|
| KR | 10-2014-0121346 A | 10/2014 |
| KR | 10-2015-0063929 A | 6/2015 |

(Continued)

*Primary Examiner* — Prem C Singh
*Assistant Examiner* — Francis C Campanell
(74) *Attorney, Agent, or Firm* — Lewis Roca Rothgerber Christie LLP

(57) ABSTRACT

A quantum dot composition includes a quantum dot having a surface to which a ligand is bonded, and a thermal decomposition auxiliary compound. The quantum dot composition may be applied to an emission layer of a light emitting element and a display device, thereby improving luminous efficiency of the light emitting element and the display device.

12 Claims, 10 Drawing Sheets

(51) Int. Cl.
  *H10K 50/16* (2023.01)
  *H10K 102/00* (2023.01)

(56) References Cited

U.S. PATENT DOCUMENTS

| | | | |
|---|---|---|---|
| 2018/0179441 A1* | 6/2018 | Park | H10K 59/38 |
| 2019/0115550 A1 | 4/2019 | Kim et al. | |
| 2020/0083470 A1* | 3/2020 | Chung | H10K 71/00 |
| 2021/0371738 A1* | 12/2021 | Lee | C09K 11/06 |
| 2022/0115610 A1* | 4/2022 | Takata | C09K 11/02 |

FOREIGN PATENT DOCUMENTS

| | | |
|---|---|---|
| KR | 10-2018-0085232 A | 7/2018 |
| KR | 10-2018-0105873 A | 10/2018 |
| KR | 10-2019-0042192 A | 4/2019 |
| KR | 10-1995371 B1 | 7/2019 |
| KR | 10-2001734 B1 | 7/2019 |
| KR | 10-2019-0106819 A | 9/2019 |
| KR | 10-2021-0018567 A | 2/2021 |

\* cited by examiner

QUANTUM DOT COMPOSITION, LIGHT EMITTING ELEMENT, AND METHOD FOR MANUFACTURING THE SAME

CROSS-REFERENCE TO RELATED APPLICATION

This application claims priority to and the benefit of Korean Patent Application No. 10-2020-0066732, filed on Jun. 2, 2020, the entire content of which is hereby incorporated by reference.

BACKGROUND

1. Field

The present disclosure herein relates to a quantum dot composition, a light emitting element including an emission layer formed from a quantum dot composition, and a method for manufacturing the same.

2. Description of the Related Art

Various kinds of display devices utilized for multimedia devices (such as a television set, a mobile phone, a tablet computer, a navigation system, and/or a game console) are being developed. In such display devices, a so-called self-luminescent display element, which accomplishes display by causing an organic compound-containing light emitting material to emit light, is utilized.

In addition, development of a light emitting element utilizing quantum dots as a light emitting material is underway as an effort to enhance the color reproducibility of the display devices, and there is a demand for increasing the luminous efficiency and service life of a light emitting element utilizing quantum dots.

SUMMARY

One or more aspects according to embodiments of the present disclosure are directed toward a quantum dot composition having improved dispersibility.

One or more aspects according to embodiments of the present disclosure are also directed toward a light emitting element having improved luminous efficiency by including an emission layer having a plurality of quantum dots that are evenly distributed and close to each other.

One or more aspects according to according to embodiments of the present disclosure are also directed toward a method for manufacturing a light emitting element, including a method for forming an emission layer having improved luminous efficiency by removing a ligand bonded to a quantum dot.

According to an embodiment of the present disclosure, a quantum dot composition includes a quantum dot having a surface to which a ligand is bonded, and a thermal decomposition auxiliary compound.

The ligand may include a head portion bonded to the surface of the quantum dot, and a tail portion containing at least one radical reactive group.

The radical reactive group may be a carbonyl group, an ester group, an ether group, a peroxy group, an azo group, a carbamate group, a thiocarbamate group, a carbonate group, or a xanthate group.

The ligand may be a monodentate ligand or a bidentate ligand.

The head portion may include a thiol group, a hydroxyl group, a phosphine group, a fluorenyl group, an amine group, or a carboxylic acid group.

The head portion may further include an alkyl group having 1 to 6 carbon atoms.

The tail portion may be represented by any one selected from Formulas 1 to 6 below.

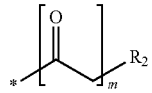

Formula 1

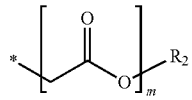

Formula 2

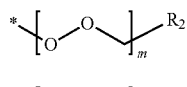

Formula 3

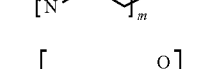

Formula 4

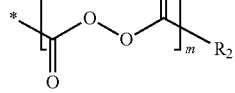

Formula 5

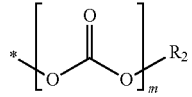

Formula 6

In Formulas 1 to 6 above, R2 may be an alkyl group having 2 to 20 carbon atoms, and m may be an integer of 1 to 5.

The thermal decomposition auxiliary compound may be an azo compound.

The azo compound may be represented by Formula 7 below.

$$Ra-N=N-Rb \qquad \text{Formula 7}$$

In Formula 7 above, Ra and Rb may each independently be an alkyl group having 2 to 20 carbon atoms.

The quantum dot having the ligand bonded to the surface thereof may be included in an amount of about 0.5 wt % to about 10 wt % with respect to a total amount of the quantum dot composition.

The thermal decomposition auxiliary compound may be included in an amount of about 0.01 wt % to about 1 wt % with respect to a total amount of the quantum dot composition.

The quantum dot composition may further include an organic solvent, and the quantum dot may be dispersed in the organic solvent.

The quantum dot may be a semiconductor nanocrystal including a core and a shell surrounding the core.

According to an embodiment of the present disclosure, a method for manufacturing a light emitting element includes forming a hole transport region on a first electrode, forming an emission layer on the hole transport region, forming an electron transport region on the emission layer, and forming a second electrode on the electron transport region, wherein the forming of the emission layer includes dispersing quantum dots having surfaces to which ligands are bonded and a thermal decomposition auxiliary compound in an organic solvent to prepare a quantum dot composition, applying the quantum dot composition on the hole transport region to form a preliminary emission layer, and heating the preliminary emission layer.

The thermal decomposition auxiliary compound may be represented by Formula 7, and the thermal decomposition auxiliary compound may be included in an amount of about 0.01 wt % to about 1 wt % with respect to a total amount of the quantum dot composition.

Formula 7

In Formula 7 above, Ra and Rb may each independently be an alkyl group having 2 to 20 carbon atoms.

The heating of the preliminary emission layer may be performed by heating the preliminary emission layer at about 120° C. to about 180° C. for 20 minutes or more.

The quantum dot may include a core and a shell surrounding the core, and the ligand may include a hydrophilic group bonded to the surface of the quantum dot and a radical reactive group.

The hydrophilic group may be a thiol group, a dithio acid group, a phosphine group, a catechol group, an amine group, or a carboxylic acid group.

In an embodiment of the present disclosure, a light emitting element includes a first electrode, a hole transport region on the first electrode, an emission layer on the hole transport region, an electron transport region on the emission layer, and a second electrode on the electron transport region, wherein the emission layer includes a quantum dot having a surface to which a hydrophilic group is bonded.

The emission layer may further include residues containing a radical reactive group.

BRIEF DESCRIPTION OF THE FIGURES

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
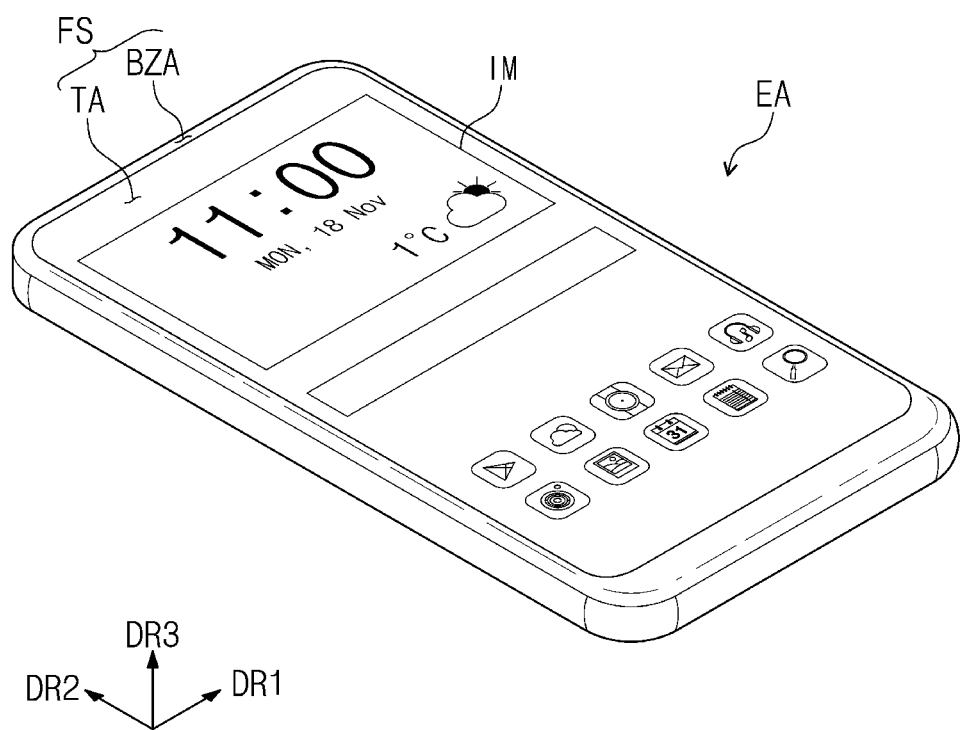
FIG. 1 is a perspective view of an electronic device of an embodiment.

The present disclosure may be modified in many alternative forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, it refers to that the element may be directly disposed on, connected to, or coupled to the other element, or that a third element may be disposed therebetween.

Meanwhile, in the present disclosure, the term "directly disposed" refers to that there is no layer, film, region, plate and/or the like added between a portion of a layer, a film, a region, a plate and/or the like and other portions. For example, "directly disposed" may refer to disposing without additional members such as an adhesive member between two layers or two members.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and unless expressly defined herein, they should not be interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a quantum dot composition according to an embodiment of the present disclosure, a light emitting element, and a display device including the same will be described with reference to the accompanying drawings.

Figure 2:
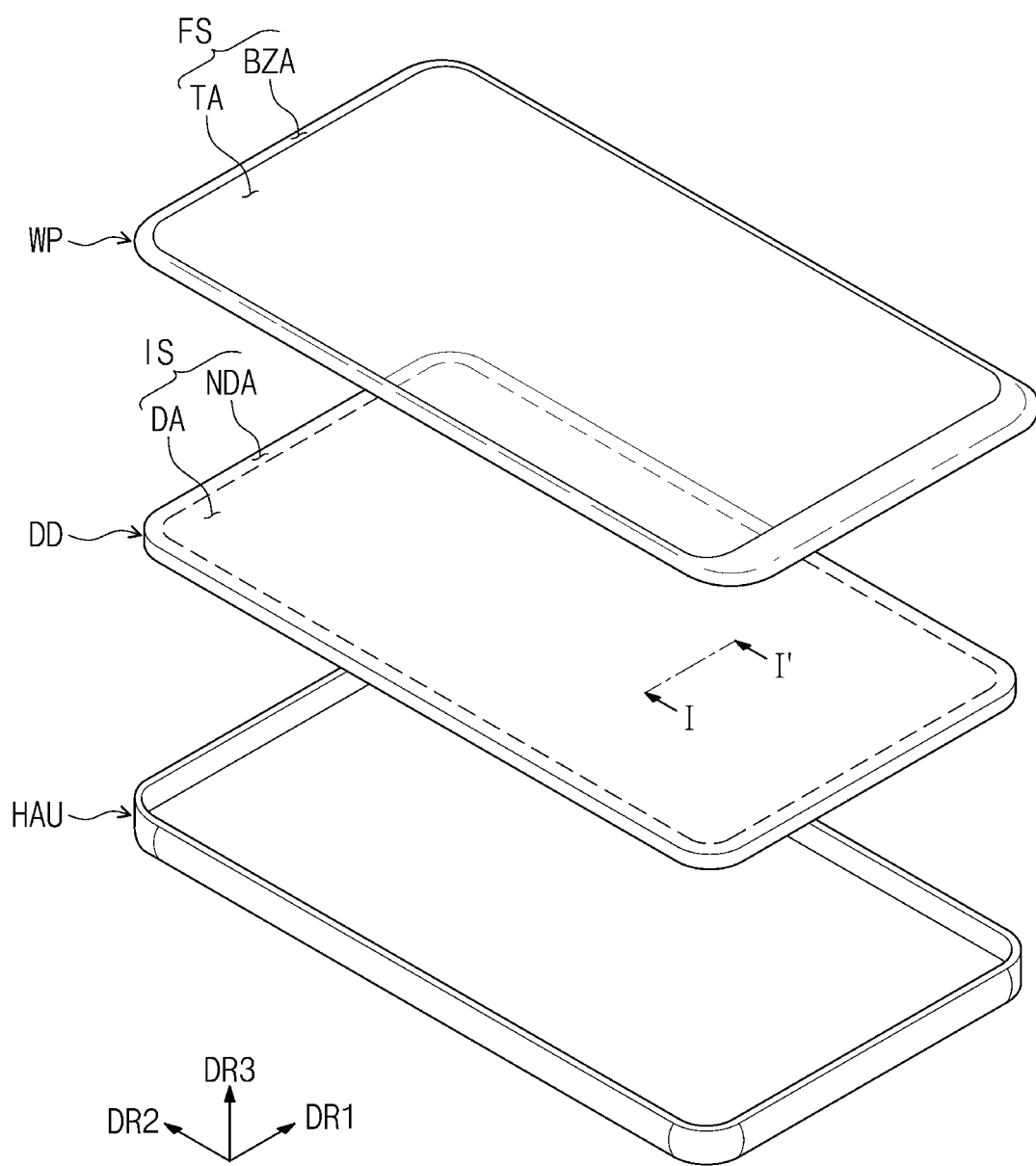
FIG. 2 is an exploded perspective view of an electronic device of an embodiment.
Figure 3:
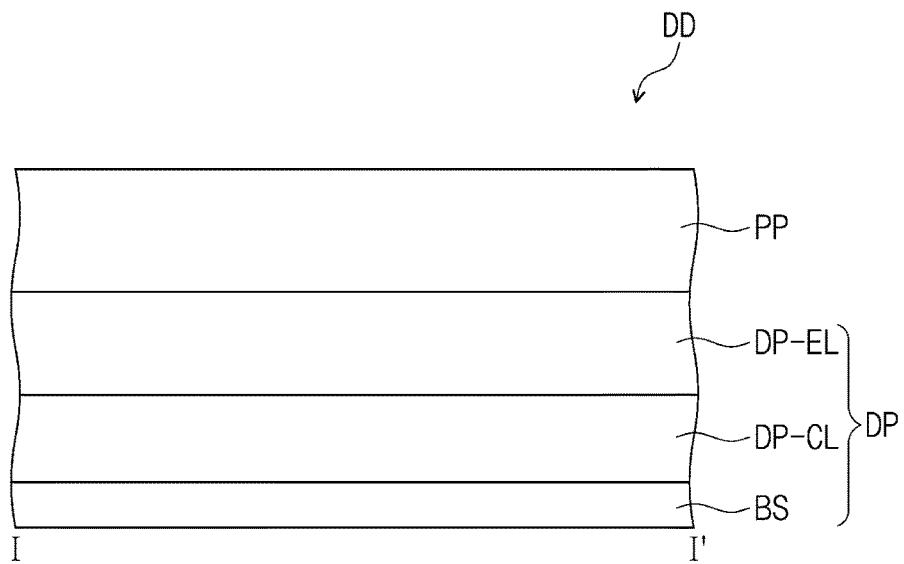
FIG. 3 is a cross-sectional view of a display device according to an embodiment, corresponding to the line I-I' of FIG. 2.
Figure 4:
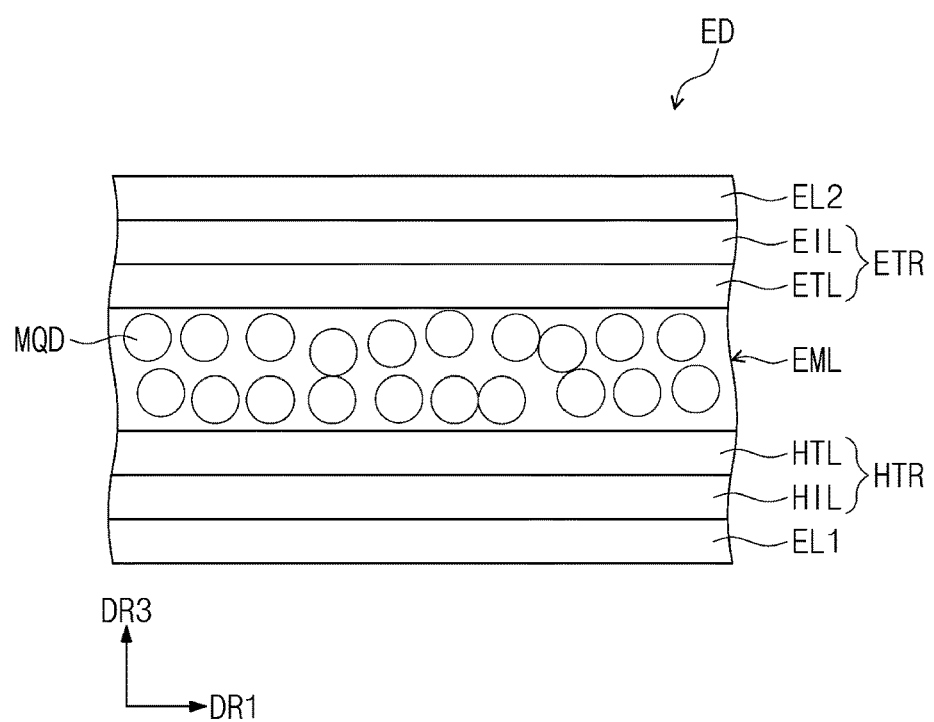
FIG. 4 is a cross-sectional view of a light emitting element of an embodiment.

FIG. 1 is a perspective view of an electronic device EA of an embodiment. FIG. 2 is an exploded perspective view of an electronic device EA of an embodiment. FIG. 3 is a cross-sectional view of a display device according to an embodiment, corresponding to the line I-I' of FIG. 2. FIG. 4 is a cross-sectional view of a display device DD of an embodiment.

In an embodiment, an electronic device EA may be a large-sized electronic device such as a television set, a monitor, and/or an outdoor billboard. In addition, the electronic device EA may be a small- and/or a medium-sized electronic device such as a personal computer, a laptop computer, a personal digital terminal, a car navigation unit, a game console, a smartphone, a tablet, and/or a camera. However, these are merely presented as an example, and thus other suitable electronic devices may be utilized without departing from the present disclosure. In the present embodiment, a smartphone is exemplarily illustrated as the electronic device EA.

The electronic device EA may include a display device DD and a housing HAU. The display device DD may display an image IM through a display surface IS, and a user may view the image provided through a transmission area TA corresponding to a front surface FS of the electronic device EA. The image IM may include a still image as well as a dynamic image. FIG. 1 illustrates that the front surface FS is parallel to a plane defined by a first direction DR1 and a second direction DR2 crossing the first direction DR1. However, this is presented as an example, and in another embodiment, the front surface FS of the electronic device EA may have a curved shape.

From among the normal directions of the front surface FS of the electronic device EA, that is, the thickness directions of the electronic device EA, a direction in which the image IM is displayed is indicated by a third direction DR3. A front surface (or an upper surface) and a rear surface (or a lower surface) of each member may be defined by the third direction DR3.

A fourth direction DR4 (see FIG. 11) may be a direction between the first direction DR1 and the second direction DR2. The fourth direction DR4 may be positioned on a plane parallel to the plane defined by the first direction DR1 and the second direction DR2. The directions indicated by the first to fourth directions DR1, DR2, DR3 and DR4 are relative concepts, and may thus be changed to other directions.

According to an embodiment, the electronic device EA may include a foldable display device having a folding area and a non-folding area, or a bending (e.g., bendable) display device having at least one bent portion.

The electronic device EA may include a display device DD and a housing HAU. In the electronic device EA, the front surface FS may correspond to a front surface of the display device DD, and may also correspond to a front surface of a window WP. Accordingly, the reference numeral FS will be used to refer to the front surface of the electronic device EA, the front surface of the display device DD, and the front surface of the window WP.

The housing HAU may accommodate the display device DD. The housing HAU may be disposed to cover the display device DD such that an upper surface, which is the display surface IS of the display device DD, is exposed. The housing HAU may cover a side surface and a bottom surface of the display device DD, and expose the overall (e.g., entire) upper surface. However, embodiments of the present disclosure are not limited thereto, and the housing HAU may cover a part of the upper surface as well as the side and bottom surfaces of the display device DD.

In the electronic device EA of an embodiment, the window WP may include an optically transparent insulating material. The window WP may include a transmission area TA and a bezel area BZA. The front surface FS of the window WP including the transmission area TA and the bezel area BZA corresponds to the front surface FS of the electronic device EA.

In FIGS. 1 and 2, the transmission area TA is shown in a rectangular shape with rounded vertices. However, this is exemplarily illustrated, and the transmission area TA may have various suitable shapes and is not limited to any one embodiment.

The transmission area TA may be an optically transparent area. The bezel area BZA may be an area having a relatively lower light transmittance than the transmission area TA. The bezel area BZA may have a set or predetermined color. The bezel area BZA may be adjacent to the transmission area TA and surround the transmission area TA. The bezel area BZA may define the shape of the transmission area TA. However, embodiments of the present disclosure are not limited to the one illustrated, and the bezel area BZA may be disposed adjacent only to one side of the transmission area TA, and a part thereof may be omitted.

The display device DD may be disposed under the window WP. In the present description, "below" may indicate a direction opposite to the direction in which the display device DD provides (e.g., displays) an image.

In an embodiment, the display device DD may be substantially configured to generate an image IM. The image IM generated in the display device DD is displayed on the display surface IS, and is viewed by a user through the transmission area TA from the outside. The display device DD includes a display area DA and a non-display area NDA. The display area DA may be an area activated according to electrical signals. The non-display area NDA may be an area covered by the bezel area BZA. The non-display area NDA is adjacent to the display area DA. The non-display area NDA may surround the display area DA.

Referring to FIG. 3, the display device DD may include a display panel DP and a light control layer PP disposed on the display panel DP. The display panel DP may include a display element layer DP-EL. The display element layer DP-EL includes a light emitting element ED.

The light control layer PP may be disposed on the display panel DP to control reflected light from the display panel DP due to external light. The light control layer PP may include, for example, a polarizing layer and/or a color filter layer.

In the display device DD of an embodiment, the display panel DP may be a light emitting display panel. For example, the display panel DP may be a quantum dot light emitting display panel including a quantum dot light emitting element. However, embodiments of the present disclosure are not limited thereto.

The display panel DP may include a base substrate BS, a circuit layer DP-CL disposed on the base substrate BS, and a display element layer DP-EL disposed on the circuit layer DP-CL.

The base substrate BS may be a member providing a base surface on which the display element layer DP-EL is disposed. The base substrate BS may be a glass substrate, a metal substrate, a plastic substrate, etc. However, embodiments of the present disclosure are not limited thereto, and the base substrate BS may be an inorganic layer, an organic layer or a composite material layer. The base substrate BS may be a flexible substrate that may be readily bent or folded.

In an embodiment, the circuit layer DP-CL may be disposed on the base substrate BS, and the circuit layer DP-CL may include a plurality of transistors. The transistors may each include a control electrode, an input electrode, and an output electrode. For example, the circuit layer DP-CL may include a switching transistor and a driving transistor to drive the light emitting element ED of the display element layer DP-EL.

FIG. 4 is a view showing a light emitting element ED according to an embodiment, and referring to FIG. 4, the light emitting element ED according to an embodiment includes a first electrode EL1, a second electrode EL2 facing the first electrode EL1, and a plurality of functional layers disposed between the first electrode EL1 and the second electrode EL2 and including an emission layer EML.

The plurality of functional layers may include a hole transport region HTR disposed between the first electrode EL1 and the emission layer EML, and an electron transport region ETR disposed between the emission layer EML and the second electrode EL2. According to an embodiment, a capping layer may be further disposed on the second electrode EL2.

The hole transport region HTR and the electron transport region ETR each may include a plurality of sub functional layers. For example, the hole transport region HTR may include a hole injection layer HIL and a hole transport layer HTL as sub functional layers, and the electron transport region ETR may include an electron injection layer EIL and an electron transport layer ETL as sub functional layers. However, embodiments of the present disclosure are not limited thereto, and the hole transport region HTR may further include an electron blocking layer as a sub functional layer, and the electron transport region ETR may further include a hole blocking layer as a sub functional layer.

In the light emitting element ED according to an embodiment, the first electrode EL1 has conductivity. The first electrode EL1 may be formed of a metal alloy or a conductive compound. The first electrode EU may be an anode. The first electrode EU may be a pixel electrode.

In the light emitting element ED according to an embodiment, the first electrode EL1 may be a reflective electrode. However, embodiments of the present disclosure are not limited thereto. For example, the first electrode EU may be a transmissive electrode, or a transflective electrode. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the first electrode EL1 may have a multi-layer structure including a reflective film or a transflective film formed of the materials described above as an example, and a transparent conductive film formed of indium tin oxide (ITO), indium zinc oxide (IZO), zinc oxide (ZnO), indium tin zinc oxide (ITZO), etc. For example, the first electrode EL1 may be a multi-layer metal film, and may have a stack structure of metal films of ITO/Ag/ITO.

The hole transport region HTR is provided on the first electrode EL1. The hole transport region HTR may include a hole injection layer HIL, a hole transport layer HTL, etc. In some embodiments, the hole transport region HTR may further include at least one of a hole buffer layer or an electron blocking layer EBL in addition to the hole injection layer HIL and the hole transport layer HTL. The hole buffer layer may compensate a resonance distance according to the wavelength of light emitted from an emission layer EML, and may thus increase luminous efficiency. Materials which may be included in the hole transport region HTR may be utilized as materials included in the hole buffer layer. The electron blocking layer is a layer that serves to prevent or substantially prevent electrons from being injected from the electron transport region ETR to the hole transport region HTR.

The hole transport region HTR may have a single layer formed of a single material, a single layer formed of a plurality of different materials, or a multi-layer structure including a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in the respective stated order from the first electrode EL1, but embodiments of the present disclosure are not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include any suitable material (e.g., general materials known in the art). The hole transport layer HTL may include, for example, carbazole-based derivatives (such as N-phenyl carbazole and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4''-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may have a thickness of about 5 nm to about 1,500 nm, for example, about 10 nm to about 500 nm. The hole injection layer HIL may have a thickness of, for example, about 3 nm to about 100 nm, and the hole transport layer HTL may have a thickness of about 3 nm to about 100 nm. For example, the electron blocking layer EBL may have a thickness of about 1 nm to about 100 nm. When the thicknesses of the hole transport region HTR, the hole injection layer HIL, the hole transport layer HTL, and the electron blocking layer EBL satisfy the above-described ranges, desired (e.g., satisfactory) electron injection properties may be obtained without a substantial increase in driving voltage.

An emission layer EML is provided on the hole transport region HTR. The emission layer EML includes a quantum dot MQD to which a plurality of hydrophilic groups are bonded. The quantum dot MQD to which the hydrophilic groups are bonded therefore has a functional group, which is a hydrophilic group, bonded to a surface of the quantum dot, and may have modified surface properties. Hereinafter, the quantum dot MQD to which the hydrophilic groups are bonded is referred to as a surface-modified quantum dot MQD. The hydrophilic group bonded to the quantum dot may be a head portion of a ligand which will be described in more detail later.

Surface-modified quantum dots MQD included in the emission layer EML may be stacked to form a layer. In FIG. 4, for example, the surface-modified quantum dots MQD having a circular cross-section are arranged to form two layers, but embodiments of the present disclosure are not limited thereto. For example, the arrangement of the surface-modified quantum dots MQD may vary according to the thickness of the emission layer EML, the shape of the quantum dot QD included in the emission layer EML, and the average diameter of the quantum dots QD. In some embodiments, in the emission layer EML, the surface-modified quantum dots MQD may be aligned to be adjacent to each other to form a single layer, or may be aligned to form a plurality of layers such as two or three layers. The quantum dot composition and the surface-modified quantum dots MQD will be described in more detail later.

In some embodiments, in the light emitting element ED, an emission layer EML may include a host and a dopant. In an embodiment, the emission layer EML may include a surface-modified quantum dot MQD as a dopant material. In addition, in an embodiment, the emission layer EML may further include a host material.

In some embodiments, in the light emitting element ED, the emission layer EML may emit fluorescence. For example, the surface-modified quantum dot MQD may be utilized as a fluorescent dopant material.

In the light emitting element ED of an embodiment, an electron transport region ETR is provided on the emission layer EML. The electron transport region ETR may include at least one among (e.g., selected from) a hole blocking layer, an electron transport layer ETL, and an electron injection layer EIL, but embodiments of the present disclosure are not limited thereto.

The electron transport region ETR may have a single layer formed of (e.g., consisting of) a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In addition, the electron transport region ETR may have a single layer structure formed of a plurality of different materials, or may have a structure in which an electron transport layer ETL/electron injection layer EIL, or a hole blocking layer/electron transport layer ETL/electron injection layer EIL are stacked in the respective stated order from the emission layer EML, but embodiments of the present disclosure are not limited thereto. The thickness of the electron transport region ETR may be, for example, from about 20 nm to about 150 nm.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, embodiments of the present disclosure are not limited thereto, and the electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), or a mixture thereof. The thickness of the electron transport layer ETL may be from about 10 nm to about 100 nm, and may be, for example, from about 15 nm to about 50 nm. When the thicknesses of the electron transport layers ETL satisfy the above-described ranges, desired (e.g., satisfactory) electron transport properties may be obtained without a substantial increase in driving voltage.

When the electron transport region ETR includes the electron injection layer EIL, the electron transport region ETR may include a halogenated metal (such as LiF, NaCl, CsF, Yb, RbCl, and/or RbI), a lanthanide metal (such as Yb), a metal oxide (such as Li$_2$O and/or BaO), or lithium quinolate (LiQ), but embodiments of the present disclosure are limited thereto. The electron injection layer EIL may also be formed of a mixture material of an electron transport material and an insulating organo-metal salt. The organo-metal salt may include, for example, metal acetates, metal benzoates, metal acetoacetates, metal acetylacetonates, and/or metal stearates. The thicknesses of the electron injection layers EIL may be about 0.1 nm to about 10 nm, for example, about 0.3 nm to about 9 nm. When the thicknesses of the electron injection layers EIL satisfy the above-described ranges, satisfactory electron injection properties may be obtained without a substantial increase in driving voltage.

The electron transport region ETR may include a hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but embodiments of the present disclosure are not limited thereto.

The second electrode EL2 is provided on the electron transport region ETR. The second electrode EL2 may be a common electrode and/or a cathode. The second electrode EL2 may be a transmissive electrode, a transflective electrode or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof (e.g., AgYb, AgMg and MgAg compounds according to content, etc.), or a mixture thereof (e.g., a mixture of Ag and Mg, a mixture of Ag and Yb, etc.). For example, the second electrode EL2 may include AgMg, AgYb, or MgAg. In some embodiments, the second electrode EL2 may have a multilayer structure including a reflective film or a transflective film formed of any of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with the auxiliary electrode, the resistance of the second electrode EL2 may decrease.

Figure 5:
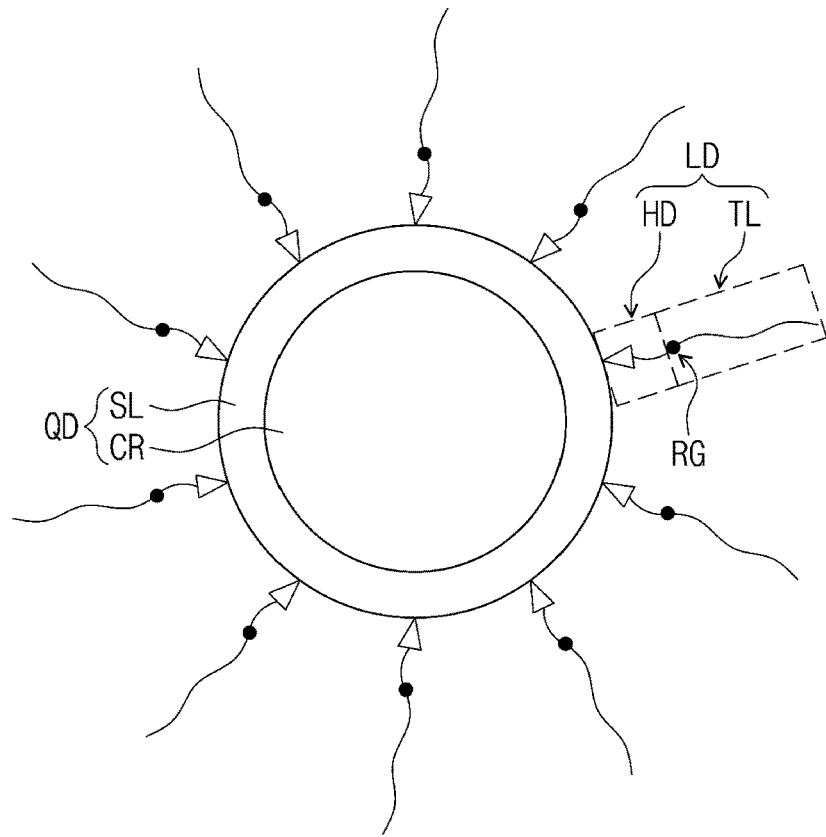
FIG. 5 is a schematic view of a quantum dot having a ligand bonded to the surface thereof of an embodiment.
Figure 6:
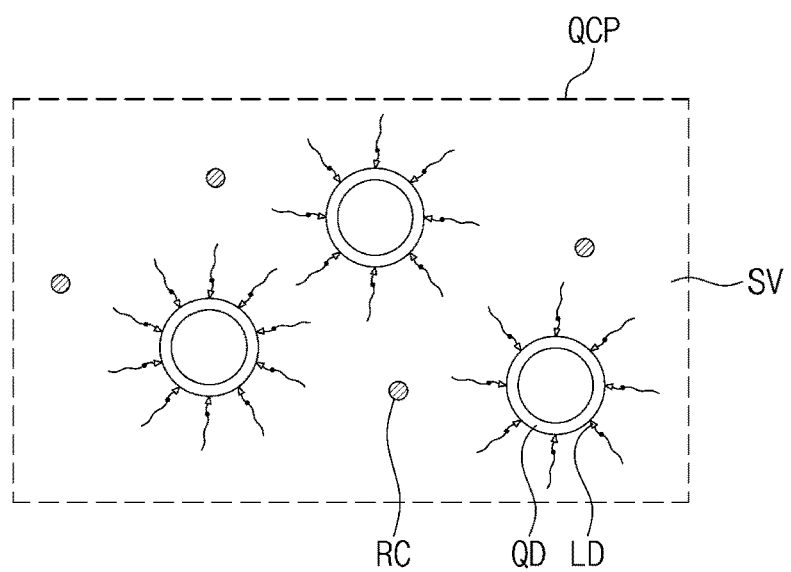
FIG. 6 is a cross-sectional view illustrating a quantum dot composition according to an embodiment.

FIG. 5 is a schematic view of a quantum dot and a ligand included in a quantum dot composition of an embodiment. FIG. 6 is a view illustrating a quantum dot composition according to an embodiment.

A quantum dot composition QCP according to an embodiment includes a quantum dot QD, a ligand LD bonded to a surface of the quantum dot QD, and a thermal decomposition auxiliary compound RC as a reaction additive. The thermal decomposition auxiliary compound RC may be, for example, an azo compound. The quantum dot QD may have a ligand LD bonded to the surface thereof. For example, the quantum dot QD may include a core CR and a shell SL, and the ligand LD may be bonded to the shell SL.

The quantum dot QD has a ligand LD bonded to the surface thereof to keep charge injection properties while improving dispersibility and capping properties. FIG. 5 schematically shows a quantum dot QD having a ligand LD bonded to the surface thereof. The ligand LD bonded to the quantum dot QD is partially removed when an emission layer is formed, thereby reducing or preventing degradation of charge injection properties.

The quantum dot QD of an embodiment may be a semiconductor nanocrystal that may be selected from a Group II-VI compound, a Group III-V compound, a Group IV-VI compound, a Group IV element, a Group IV compound, and a combination thereof.

The Group II-VI compound may be selected from a binary compound selected from CdSe, CdTe, ZnS, ZnSe, ZnTe, ZnO, HgS, HgSe, HgTe, MgSe, MgS, and a mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group III-V compound may be selected from a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V semiconductor compound may further include a Group II metal (e.g., InZnP, etc.).

The Group IV-VI compound may be selected from a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; and a quaternary compound selected from SnPbSSe, SnPbSeTe, SnPbSTe, and a mixture thereof. The Group IV element may be selected from Si, Ge, and a mixture thereof. The Group IV compound may be a binary compound selected from SiC, SiGe, and a mixture thereof.

The Group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

In some embodiments, a binary compound, a ternary compound, or a quaternary compound may be present in a particle in a uniform concentration distribution, or may be present in the same particle in a partially different (e.g., non-uniform) concentration distribution. That is, the elements of the binary compound, the ternary compound, or the quaternary compound may be present in a particle with a uniform concentration distribution, or may be present in the particle with a non-uniform concentration distribution. In some embodiments, a core/shell structure in which one quantum dot surrounds another quantum dot may be present. An interface between a core and a shell may have a concentration gradient in which the concentration of an element present in a shell becomes lower (decreases) toward the center.

In some embodiments, a quantum dot QD may have the core/shell structure including a core CR having (e.g., formed of) nano-crystals, and a shell SL surrounding the core CR, which are described above. The shell SL of the quantum dot QD having the core/shell structure may serve as a protection layer to reduce or prevent the chemical deformation of the core CR so as to maintain semiconductor properties, and/or as a charging layer to impart electrophoresis properties to the quantum dot QD. The shell SL may be a single layer or multiple layers. An interface between the core CR and the shell SL may have a concentration gradient in which the concentration of an element present in the shell SL becomes lower (decreases) toward the center. An example of the shell SL of the quantum dot QD having the core-shell structure may be a metal oxide, a non-metal oxide, a semiconductor compound, or a combination thereof.

For example, the metal oxide or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a ternary compound such as $MgAl_2O_4$, $CoFe_2O_4$, $NiFe_2O_4$, and/or $CoMn_2O_4$, but embodiments of the present disclosure are not limited thereto.

In some embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

A quantum dot QD may have a full width of half maximum (FWHM) of a light emission wavelength spectrum of about 45 nm or less, for example, about 40 nm or less, or about 30 nm or less, and color purity and/or color reproducibility may be enhanced in the above ranges. In addition, light emitted through such a quantum dot is emitted in all directions, and thus a wide viewing angle may be improved.

The form of a quantum dot QD is not particularly limited as long as it is a suitable form (e.g., commonly utilized in the related art), for example, a quantum dot in the form of spherical, pyramidal, multi-arm, and/or cubic nanoparticles, nanotubes, nanowires, nanofibers, nanoparticles, etc. may be utilized.

A quantum dot QD may control the color of emitted light according to the particle size thereof, and thus the quantum dot QD may have various suitable light emission colors such as blue, red, green, etc. The smaller the particle size of the quantum dot QD, the shorter the wavelength region of light may be emitted. For example, in the quantum dot QD having the same core, the particle size of a quantum dot emitting green light may be smaller than the particle size of a quantum dot emitting red light. In some embodiments, in the quantum dot QD having the same core, the particle size of a quantum dot emitting blue light may be smaller than the particle size of a quantum dot emitting green light. However, embodiments of the present disclosure are not limited thereto, and even in the quantum dot QD having the same core, the particle size may be adjusted according to materials and thickness of a shell.

In some embodiments, when a quantum dot QD is to provide (or has) one of various suitable light emission colors such as blue, red, green, etc., the quantum dot QD providing (or having) a different light emission color may have a different core material.

As described above, the quantum dot QD may include a core CR and a shell SL surrounding the core CR. However, embodiments of the present disclosure are not limited thereto, and the quantum dot QD may have a single-layer structure or may have a plurality of shells.

A ligand LD includes a head portion HD bonded to a surface of the quantum dot QD, and a tail portion TL exposed to the outside and may be removed through a radical reaction.

The head portion HD of the ligand LD is bonded to the surface of the quantum dot QD to form a surface-modified quantum dot MQD without being removed even after the radical reaction. For example, when the quantum dot QD includes the core CR and the shell SL, the head portion HD may be bonded to the shell SL. For example, when the head portion HD includes a thiol group, and the shell SL includes a metal ion Zn (e.g., $Zn^{2+}$), the thiol group of the head portion HD is bonded to Zn to allow the ligand LD to be bonded to the quantum dot QD.

The head portion HD may include a functional group to bond (e.g., bind) to the surface of the quantum dot QD. The functional group to bond (e.g., bind) to the surface of the quantum dot QD may be a hydrophilic group, and may include, for example, a thiol group, a hydroxyl group, a phosphine group, a fluorenyl group, an amine group, and/or a carboxylic acid group. However, embodiments of the present disclosure are not limited thereto.

When the head portion HD includes a single functional group to bond (e.g., bind) to the surface of the quantum dot QD, the ligand LD may be a monodentate ligand. When the head portion HD includes two functional groups to bond (e.g., bind) to the surface of the quantum dot QD, the ligand LD may be a bidentate ligand. The head portion HD may include a functional group to bond (e.g., bind) to the surface of a shell SL of the quantum dot QD.

In some embodiments, the head portion HD may further include an alkyl group having 1 to 6 carbon atoms. The head part HD further includes the alkyl group having 1 to 6 carbon atoms, or for example, 1 to 4 carbon atoms, to ensure stability to the quantum dot QD, but may not inhibit electron injection.

The tail portion TL of the ligand LD is a portion removed in the manufacturing of an emission layer EML and includes at least one radical reactive group RG. The radical reactive group RG is not particularly limited as long as it is a functional group capable of reacting with a thermal decomposition auxiliary compound RC. For example, the radical reactive group RG may be a carbonyl group, an ester group, an ether group, a peroxy group, an azo group, a carbamate group, a thiocarbamate group, a carbonate group, or a xanthate group.

The tail portion TL of the ligand LD may further include an alkyl group having 2 to 20 carbon atoms. The tail portion TL further includes an alkyl group to control the length of the ligand LD so as to perform a function of controlling the dispersibility of the quantum dots QD in the quantum dot composition QCP. When the number of carbon atoms of the alkyl group of the tail portion TL is less than 2, the distance between the quantum dots QD may be too close, and when the number of carbon atoms is greater than 20, the distance between the quantum dots QD may be too far.

In an embodiment, the tail portion TL may be represented by any one selected from Formulas 1 to 6 below.

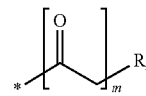

Formula 1

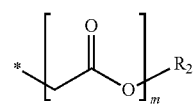

Formula 2

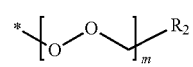

Formula 3

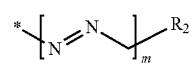

Formula 4

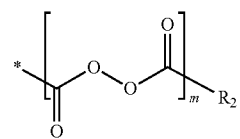

Formula 5

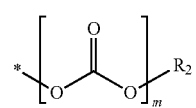

Formula 6

In Formulas 1 to 6 above, R2 is a substituted or unsubstituted alkyl group having 2 to 20 carbon atoms, and m is an integer of 1 to 5.

"*⸺" in the present description indicates a position to be connected. In Formulas 1 to 6, "*⸺" indicates a position connected to the head portion.

In order to effectively disperse the quantum dots QD in the quantum dot composition QCP, the quantum dots QD having a ligand LD bonded to the surface thereof may be included in an amount of about 0.5 wt % or greater, or about 1 wt % or greater, and about 10 wt % or less, or about 5 wt % or less with respect to the total amount of the quantum dot composition QCP.

The quantum dot composition QCP according to an embodiment includes a thermal decomposition auxiliary compound RC. The thermal decomposition auxiliary compound RC is not particularly limited as long as it is a compound capable of performing a radical removal reaction of the ligand LD (or a portion of the ligand LD), for example, the thermal decomposition auxiliary compound RC may be an azo compound. The quantum dot composition QCP includes the azo compound RC, and may thus effectively perform the removal reaction of the ligand LD, which is performed later (e.g., performed when forming the emission layer EML). The azo compound RC may be represented by Formula 7 below.

   Formula 7

In Formula 7 above,

Ra and Rb are each independently a substituted or unsubstituted alkyl group having 2 to 20 carbon atoms.

The azo compound RC may be utilized alone or in combination of two or more. The azo compound RC may be included in an amount of about 0.01 wt % or greater, or about 0.03 wt % or greater, and about 1 wt % or less, or about 0.7 wt % or less with respect to the total amount of the quantum dot composition QCP to efficiently perform and accelerate the reaction.

The quantum dot composition QCP may further include an organic solvent SV. For example, the organic solvent SV may include hexane, octane, toluene, chloroform, dimethyl sulfoxide, dimethyl formamide, decane, dodecane hexadecene, cyclohexylbenzene, tetrahydronaphthalene, ethylnaphthalene, ethylbiphenyl, isopropylnaphthalene, diisopropylnaphthalene, diisopropylbiphenyl, xylene, isopropylbenzene, pentylbenznene, diisopropylbenzene, decahydronaphthalene, phenylnaphthalene, cyclohexyldecahydronaphthalene, decylbenzene, dodecylbenzene, octylbenzene, cyclohexane, cyclopentane, cycloheptane, etc. However, embodiments of the present disclosure are not limited thereto.

Figure 7:
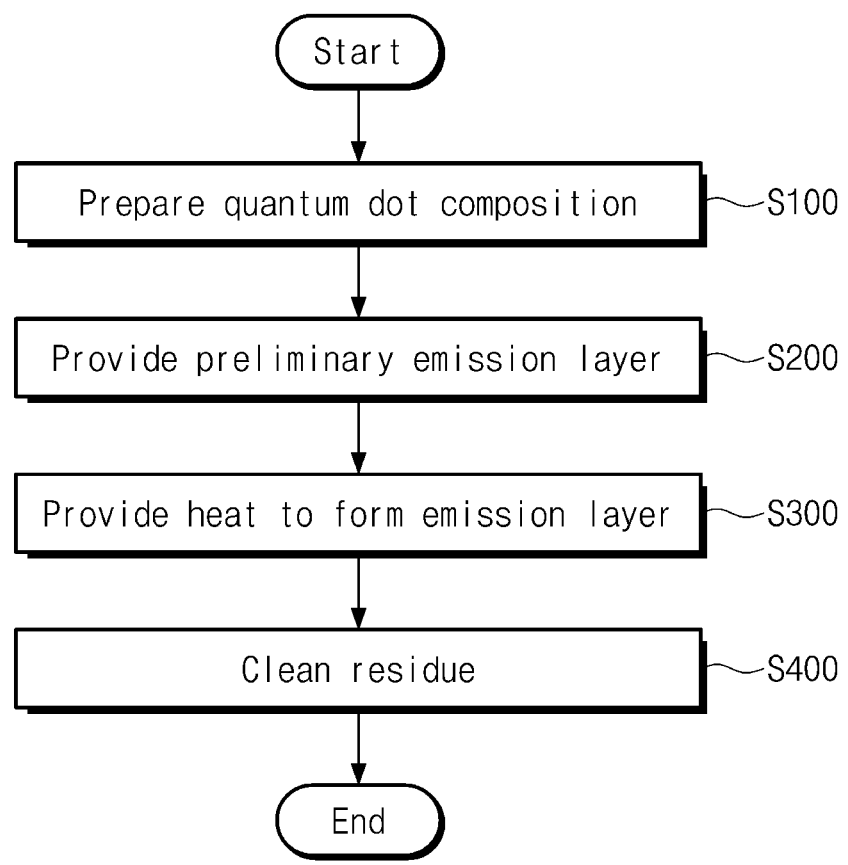
FIG. 7 is a flowchart showing a method for manufacturing a light emitting element according to an embodiment.
Figure 8:
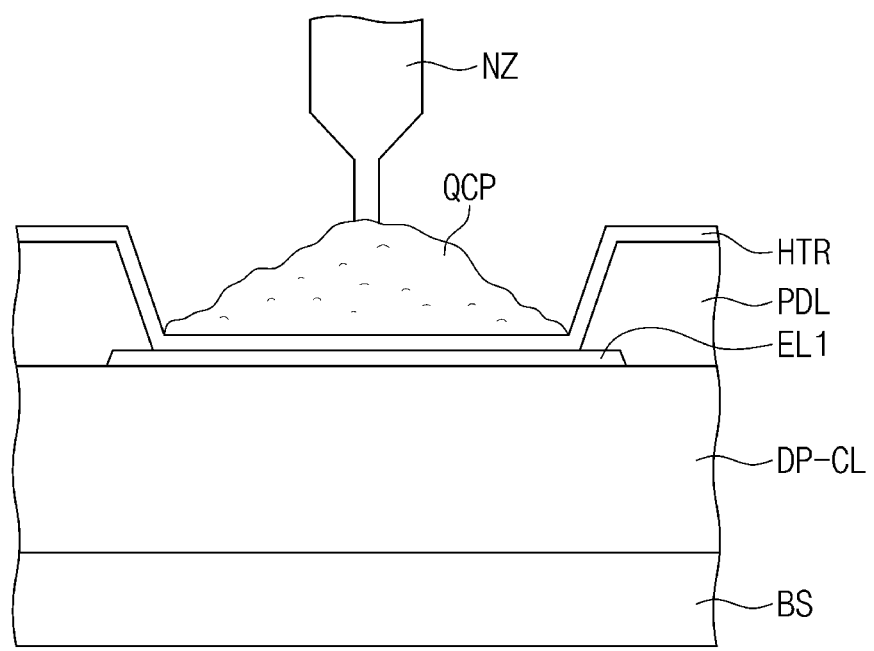
FIG. 8 is a cross-sectional view schematically showing one or more acts of forming a preliminary emission layer according to an embodiment.
Figure 9:
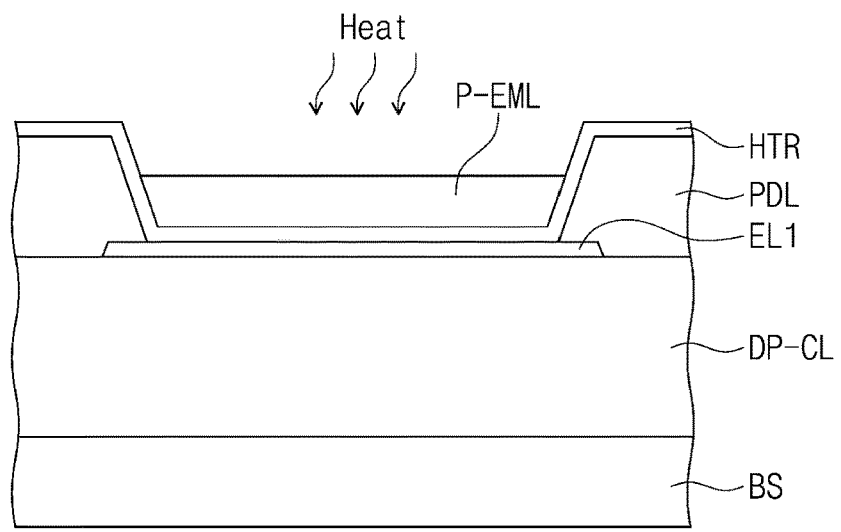
FIG. 9 is a view schematically showing one or more acts of forming an emission layer according to an embodiment.
Figure 10:
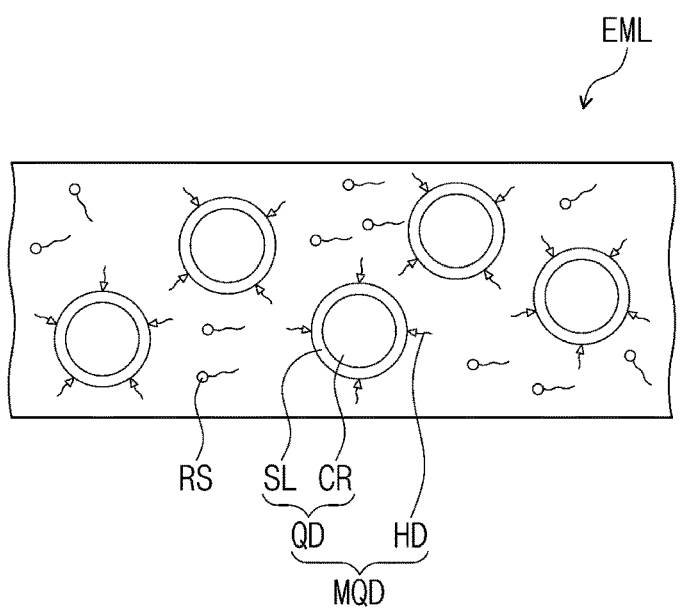
FIG. 10 is a cross-sectional view of an emission layer according to an embodiment.

FIG. 7 is a flowchart showing a method for manufacturing a light emitting element according to an embodiment. FIGS. 8 and 9 each schematically show one or more acts of a method for manufacturing a light emitting element according to an embodiment. FIG. 10 is a cross-sectional view showing an emission layer manufactured according to an embodiment.

A method for manufacturing a light emitting element includes forming a hole transport region on a first electrode, forming an emission layer on the hole transport region, forming an electron transport region on the emission layer, and forming a second electrode on the electron transport region.

Referring to FIG. 7, the forming of an emission layer of a light emitting element according to an embodiment includes preparing a quantum dot composition (S100), providing a preliminary emission layer (S200), and providing heat to form an emission layer (or heating the preliminary emission layer to form an emission layer) (S300).

In the preparing of a quantum dot composition (S100), a quantum dot (or quantum dots) QD having a ligand bonded to the surface thereof and a thermal decomposition auxiliary compound RC are dispersed in an organic solvent SV. The quantum dot QD may have the ligand LD bonded to the surface thereof to increase dispersibility in the organic solvent SV.

FIG. 8 schematically shows the act of providing a preliminary emission layer (S200) in a method for manufacturing a light emitting element according to an embodiment.

The providing of the preliminary emission layer (S200) is performed by applying a quantum dot composition QCP on a hole transport region HTR.

The method for applying the quantum dot composition QCP on the hole transport region HTR is not particularly limited, and a spin coating method, a cast method, a LB (Langmuir-Blodgett) method, an inkjet printing method, a laser printing method, a laser thermal transfer method (LITI), etc., may be utilized. FIG. 8 illustrates that the quantum dot composition QCP is applied between a pixel defining film PDL through a nozzle NZ, but embodiments of the present disclosure are not limited thereto.

The thickness of the emission layer EML is not particularly limited, but may be, for example, about 5 nm to about 100 nm or about 10 nm to about 50 nm.

FIG. 9 is a cross sectional view schematically showing the act of providing heat to form an emission layer (S200) in a method for manufacturing a light emitting element according to an embodiment. According to an embodiment, the providing of heat to a preliminary emission layer P-EML may be performed by providing heat of about 120° C. to about 180° C. to the preliminary emission layer P-EML for 20 minutes or more to induce reaction in which a part of the ligand LD bonded to the quantum dot QD is removed, and curing the preliminary emission layer P-EML. That is, the emission layer is formed through heating the preliminary emission layer P-EML at about 120° C. to about 180° C. for 20 minutes or more. When heat is provided to the preliminary emission layer P-EML, the thermal decomposition auxiliary compound RC absorbs heat and acts as a radical initiator. The generated radical reacts with a radical reactive group RG of a tail portion TL of the ligand LD to break the bond between the tail portion TL and the head portion HD. That is, in the emission layer EML, the quantum dot QD only has the head portion HD of the ligand attached to its surface, and the tail portion TL of the ligand is separated from the head portion HD and is not attached to the quantum dot QD.

After the forming of the emission layer (S300) in the method for manufacturing the light emitting element according to an embodiment, cleaning residues RS (S400) may be further included. In the cleaning of the residues, some residues RS may be removed, and some may remain in the emission layer EML.

FIG. 10 is a cross-sectional view showing an emission layer EML manufactured according to an embodiment. In the providing of heat to the preliminary emission layer P-EML, the ligand LD reacts with an azo compound RC to form an emission layer EML in the form of a surface-modified quantum dot MQD in which the tail portion is removed. The removal of a part of the ligand LD bonded to the quantum dot QD makes the distance between the quantum dots QD closer. The removed tail portion TL and the decomposed thermal decomposition auxiliary compound RC are present as the residues RS, and the residues RS may be removed in the cleaning act, or some may remain in the emission layer EML.

The quantum dot composition according to an embodiment of the present disclosure may exhibit suitable (e.g., excellent) luminous efficiency when applied to a light emitting element, while enhancing dispersibility and capping properties of a quantum dot.

The quantum dot having an organic ligand bonded to the surface thereof may have improved dispersibility and capping properties in the quantum dot composition, but when applied to a light emitting element, the organic ligand may inhibit charge injection properties, and thus the luminous efficiency of the light emitting element may be reduced. However, the quantum dot composition according to an embodiment of the present disclosure includes a ligand containing a radical reactive group and a thermal decomposition auxiliary compound to remove a part of the ligand bonded to the quantum dot when applied to form an emission layer, thereby reducing the distance between the quantum dots. Accordingly, an increase in the stacking density of the quantum dots, reduction or prevention of charge injection property degradation, and improvement in luminous efficiency properties of the light emitting element may be achieved.

Hereinafter, the present disclosure will be described in more detail through specific Examples and Comparative Examples. Examples below are only presented as examples to help the understanding of the present disclosure, and thus the scope of the present disclosure is not limited thereto.

1. Preparation of Example Quantum Dot Composition 1

A quantum dot 1 (Example compound 1) and an azo compound, 2,2'-(diazene-1,2-diyl)bis(2-methylpropanenitrile) are dispersed in octane at about 1 wt % and about 0.03 wt %, respectively, to prepare an Example quantum dot composition 1. In addition, for each of the quantum dots 2 to 13 (Example compounds 2 to 3), the same method was applied to respectively prepare Example quantum dot compositions 2 to 13. The quantum dots QD are all the same.

QUANTUM DOTS TO WHICH LIGANDS ARE BONDED ACCORDING TO EXAMPLES

Example Compound 1

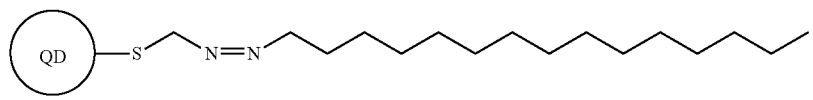

Example Compound 2

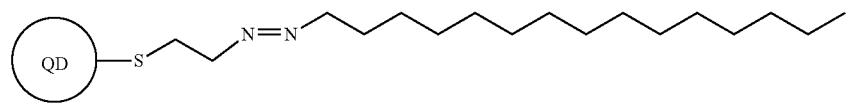

Example Compound 3

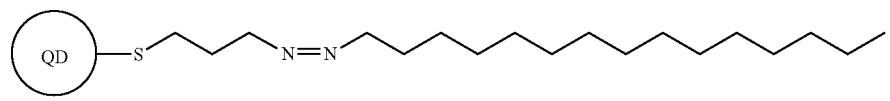

Example Compound 4

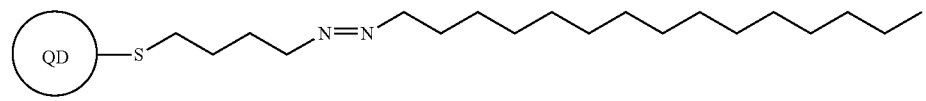

Example Compound 5

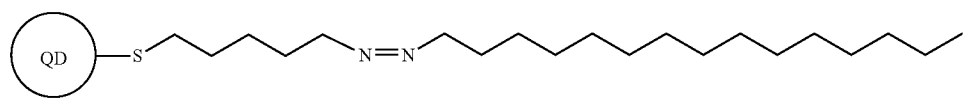

Example Compound 6
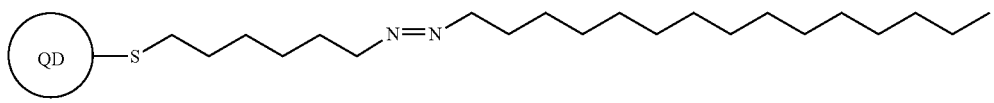
Example Compound 7
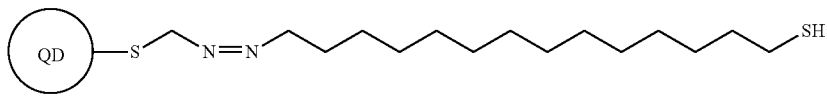
Example Compound 8
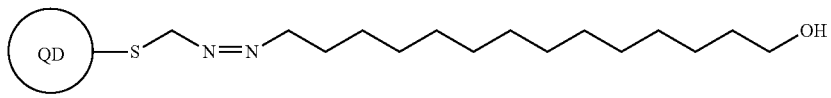
Example Compound 9
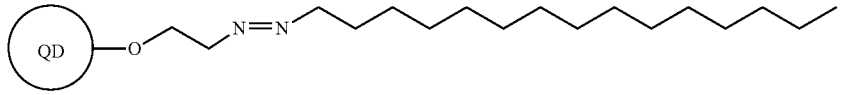
Example Compound 10
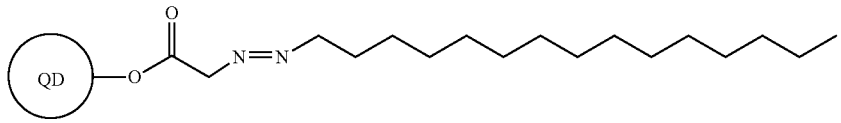
Example Compound 11
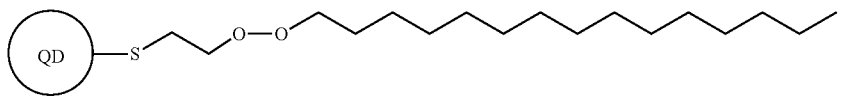
Example Compound 12
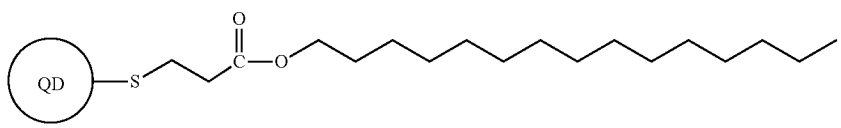

Example Compound 13

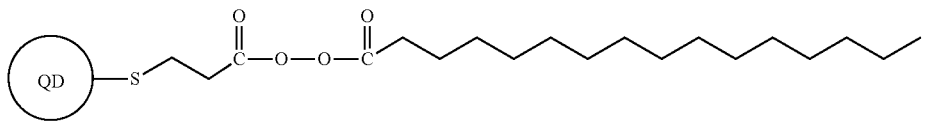

2. Preparation of Comparative Example Quantum Dot Composition 1

Quantum Dots 1 (Comparative compound 1) and 2 (Comparative compound 2) of Comparative Examples 1-2 below were respectively dispersed in octane at about 1 wt % to prepare Comparative Example Quantum dot compositions 1 and 2. The quantum dot QDs are the same as the quantum dots of Examples.

QUANTUM DOTS OF COMPARATIVE EXAMPLES

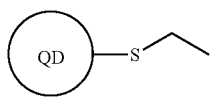

[Comparative compound 1]

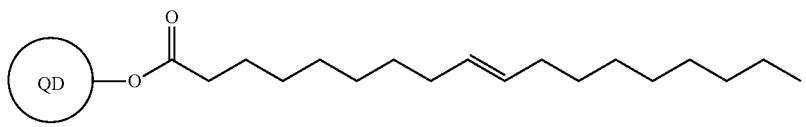

[Comparative compound 2]

3. Evaluation of Dispersion Particle Size and Discharge Stability of Quantum Dot Compositions Dispersion particle sizes were measured utilizing ELSZ-2000ZS (Otsuka) for each of the quantum dot compositions of Examples 1-13 and Comparative Examples 1-2. In addition, the discharge stability was evaluated in terms of the attachment accuracy (e.g., deposition accuracy) from an inkjet head, and for 30 days of discharge, the attachment accuracy (e.g., deposition accuracy) of ±5 μm in the x- and y-axis directions was evaluated and marked as Spec.-in when the accuracy is met, or marked as N.G. when the deposition error is greater than ±5 μm in the x- and y-axis directions. The results are shown in Table 1 below.

TABLE 1

|  | Dispersion particle size (nm) | Dispersion particle size for 30 days of discharge (nm) | Discharge stability |
| --- | --- | --- | --- |
| Example quantum dot composition 1 | 7 | 8 | Spec.-in |
| Example quantum dot composition 2 | 8 | 9 | Spec.-in |
| Example quantum dot composition 3 | 8 | 8 | Spec.-in |
| Example quantum dot composition 4 | 8 | 8 | Spec.-in |
| Example quantum dot composition 5 | 8 | 9 | Spec.-in |
| Example quantum dot composition 6 | 8 | 9 | Spec.-in |
| Example quantum dot composition 7 | 9 | 9 | Spec.-in |
| Example quantum dot composition 8 | 7 | 8 | Spec.-in |
| Example quantum dot composition 9 | 7 | 8 | Spec.-in |
| Example quantum dot composition 10 | 8 | 9 | Spec.-in |
| Example quantum dot composition 11 | 8 | 8 | Spec.-in |
| Example quantum dot composition 12 | 7 | 8 | Spec.-in |
| Example quantum dot composition 13 | 7 | 8 | Spec.-in |
| Comparative Example quantum dot composition 1 | 45 | 165 | N.G. |
| Comparative Example quantum dot composition 2 | 7 | 8 | Spec.-in |

Referring to Table 1, the quantum dot having the ligand bonded to the surface thereof according to an embodiment may have desired (e.g., excellent) dispersibility in the quantum dot composition, and thus it is confirmed that the discharge stability is excellent. Meanwhile, the Comparative Example quantum dot composition 1 has a ligand containing a relatively short chain of 2 carbon atoms bonded to the quantum dot, and thus was evaluated to have a fairly low dispersibility property in an organic solvent and poor discharge stability. Comparative Example quantum dot composition 2 has a ligand containing a long chain of 17 carbon atoms bonded to the quantum dot, and thus has excellent dispersibility in an organic solvent and excellent discharge stability.

4. Evaluation of Light Emitting Element Property

1) Manufacturing of Light Emitting Elements

An ITO glass substrate (25×25 mm, 15 Ω/sq(□)) was ultrasonically washed sequentially utilizing distilled water and isopropanol, and UV ozone-cleaned for 30 minutes. PEDOT-PSS (Clevios™ AI4083) was spin coated on the cleaned substrate, and baked at 110° C. for 30 minutes to form a hole injection layer having a thickness of about 40 nm. A polyvinylcarbazole solution in which polyvinylcarbazole was dissolved in chlorobenzene in an amount of about 1.1 wt % was prepared, and the solution was spin coated on the hole injection layer, and then, baked at 150° C. for 30 minutes in a glove box under a nitrogen atmosphere to form a hole transport layer having a thickness of about 30 nm.

A preliminary emission layer was formed by spin coating the prepared (i.e., one of the respective prepared) quantum dot composition on the hole transport layer. Thereafter, baking was performed at 110° C. for 30 minutes in a glove box under a nitrogen atmosphere to form an emission layer having a thickness of about 35 nm. Subsequently, a solution in which ZnO nanoparticles are dispersed in ethanol in an amount of about 2.0 wt % was prepared, and the solution was spin coated on the emission layer, and then baked at 110° C. for 30 minutes in a glove box under a nitrogen atmosphere to from an electron transport layer having a thickness of about 60 nm. On the electron transport layer, aluminum (Al) was deposited to a thickness of about 100 nm through thermal evaporation to form a cathode.

2) Evaluation of Light Emitting Element Property

The luminance and efficiency of the light emitting elements according to each of Examples 1-13 and Comparative Examples 1-2 were measured, and the results are shown in Table 2 below. Power was supplied from a current-voltmeter (Keithley SMU 236) and the measurement was performed utilizing a luminance meter PR650.

TABLE 2

|  | Emission layer | Driving voltage (V) | Efficiency (cd/A) |
| --- | --- | --- | --- |
| Example 1 | Example quantum dot composition 1 | 3.5 | 7.4 |
| Example 2 | Example quantum dot composition 2 | 3.4 | 7.5 |
| Example 3 | Example quantum dot composition 3 | 3.8 | 7.0 |
| Example 4 | Example quantum dot composition 4 | 3.7 | 7.2 |
| Example 5 | Example quantum dot composition 5 | 3.7 | 7.1 |
| Example 6 | Example quantum dot composition 6 | 3.6 | 7.3 |
| Example 7 | Example quantum dot composition 7 | 3.5 | 7.3 |
| Example 8 | Example quantum dot composition 8 | 3.2 | 7.5 |
| Example 9 | Example quantum dot composition 9 | 3.7 | 6.9 |
| Example 10 | Example quantum dot composition 10 | 3.6 | 6.8 |
| Example 11 | Example quantum dot composition 11 | 3.4 | 7.3 |
| Example 12 | Example quantum dot composition 12 | 3.4 | 7.7 |
| Example 13 | Example quantum dot composition 13 | 3.5 | 7.8 |
| Comparative Example 1 | Comparative Example quantum dot composition 1 | 5.7 | 0.3 |
| Comparative Example 2 | Comparative Example quantum dot composition 2 | 4.8 | 5.4 |

Referring to Table 2, it is seen that the light emitting elements of Examples 1-13 each have a low driving voltage and desired (e.g., excellent) luminous efficiency compared to those of each of Comparative Examples 1-2.

The light emitting element of Comparative Example 1 has an emission layer manufactured from a quantum dot composition having low dispersibility, thereby failing to have quantum dots that are evenly distributed in the emission layer and thereby having fairly low luminous efficiency.

In the light emitting element of Comparative Example 2, it is seen that a long organic ligand blocking or preventing electron injection remains in the emission layer, and thus the distance between quantum dots is far, and the organic ligand blocks or inhibits electron and hole injection at each interface, thereby reducing efficiency of the light emitting element.

Meanwhile, the light emitting element of each of Examples 1-13 is manufactured from a quantum dot composition having desired (e.g., excellent) dispersibility to have the quantum dots evenly distributed, and the inclusion of an azo compound leads to removing a tail portion of a ligand bonded to the surface of the quantum dot effectively in the manufacturing of the emission layer to reduce the distance between quantum dots, thereby improving the film density so as to achieve a lower driving voltage and improved luminous efficiency.

Referring back to FIGS. 11 to 13, a display device DD including a light emitting element ED according to an embodiment will be described in more detail.

Figure 11:
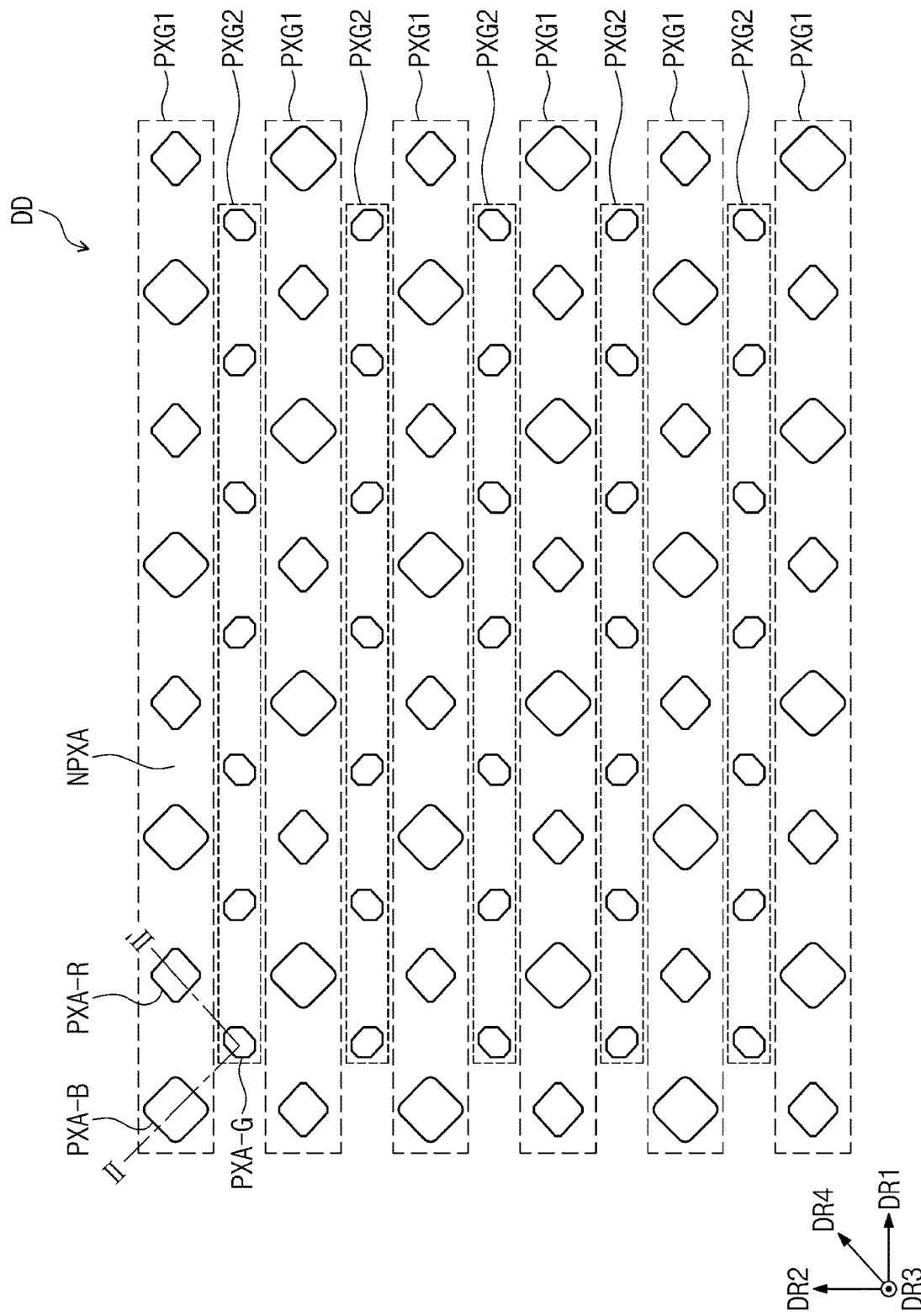
FIG. 11 is a plan view of a display device according to an embodiment.
Figure 12:
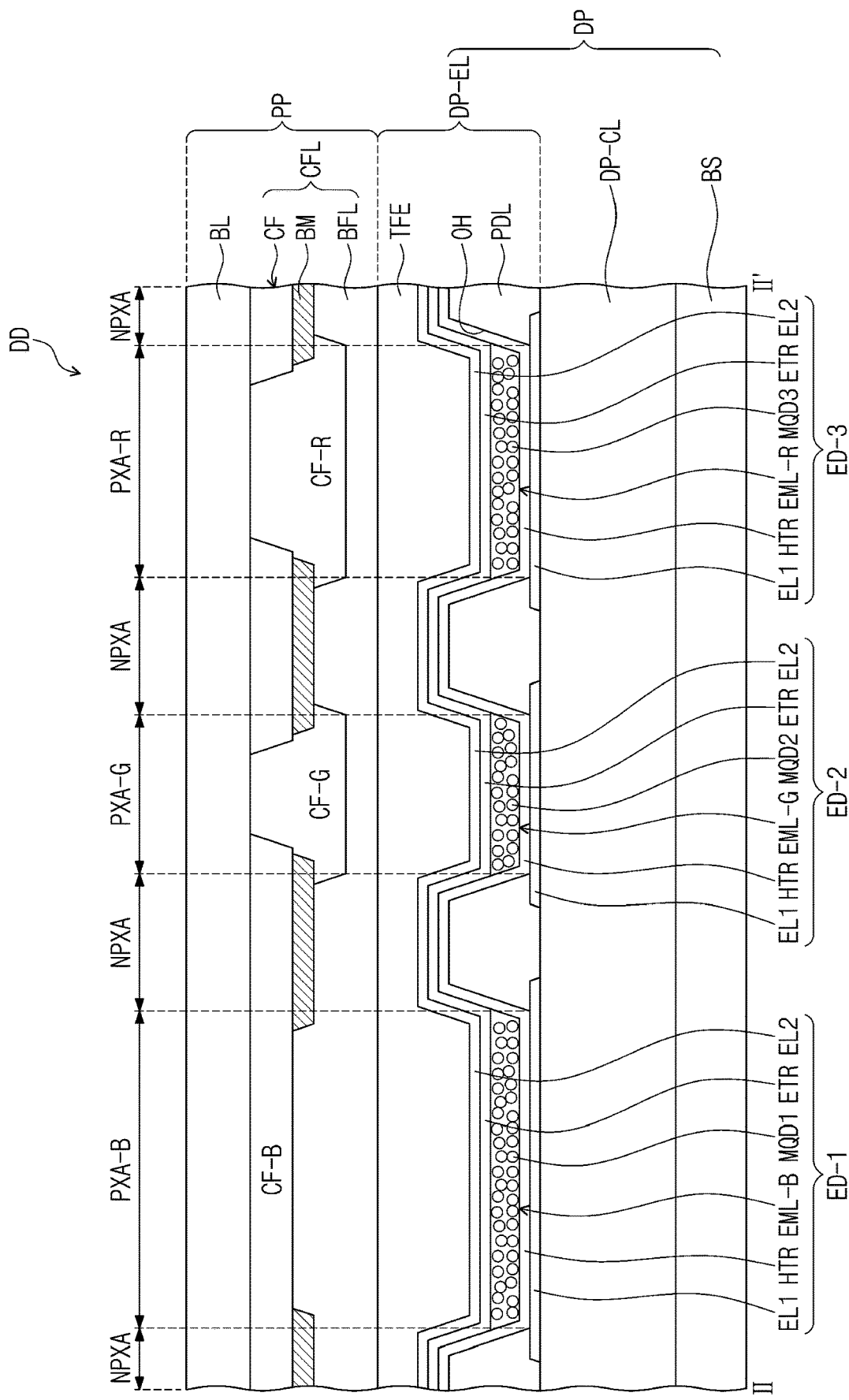
FIG. 12 is a cross-sectional view of a display device according to an embodiment, corresponding to the line II-II' of FIG. 11.
Figure 13:
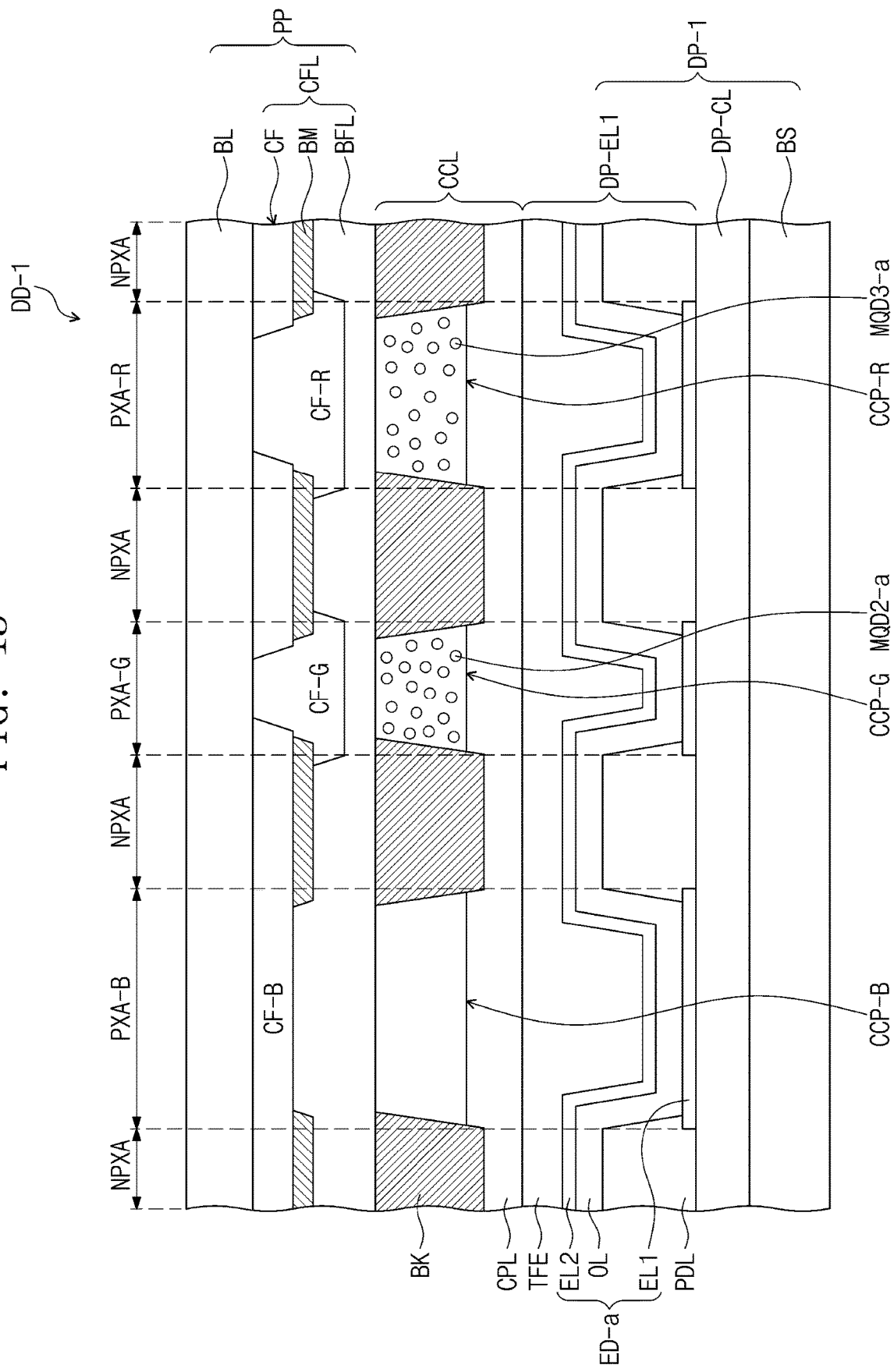
FIG. 13 is a cross-sectional view of a display device according to an embodiment.

FIG. 11 is a plan view of a display device DD according to an embodiment. FIG. 12 is a cross-sectional view of a display device DD according to an embodiment. FIG. 13 is a cross-sectional view corresponding to the line II-II' of FIG. 11.

The display device DD of an embodiment may include a plurality of light emitting elements ED-1, ED-2, and ED-3, and the light emitting elements ED-1, ED-2, and ED-3 may include emission layers EML-B, EML-G, and EML-R having surface-modified quantum dots MQD1, MQD2, and MQD3 respectively.

In some embodiments, the display device DD may include a display panel DP containing the plurality of light emitting elements ED-1, ED-2 and ED-3, and a light control layer PP disposed on the display panel DP. In some embodiments, unlike the view illustrated in the drawing, the light control layer PP may be omitted from the display device DD of an embodiment.

The display panel DP may include a base substrate BS, a circuit layer DP-CL, and a display element layer DP-EL provided on the base substrate BS, and the display element layer DP-EL may include a pixel defining film PDL, light emitting elements ED-1, ED-2 and ED-3 disposed between (e.g., between portions of) the pixel defining film PDL, and an encapsulation layer TFE disposed on the light emitting elements ED-1, ED-2 and ED-3.

Referring to FIGS. 11 and 12, the display device DD may include a non-light emission area NPXA and light emission areas PXA-B, PXA-G and PXA-R. Each of the light emission areas PXA-B, PXA-G and PXA-R may be an area capable of emitting light generated from each of the light emitting elements ED-1, ED-2 and ED-3. The light emission areas PXA-B, PXA-G and PXA-R may be spaced apart from one another on a plane.

The light emission areas PXA-B, PXA-G and PXA-R may be divided into a plurality of groups according to the color of light generated from the light emitting elements ED-1, ED-2 and ED-3. In the display device DD of an embodiment illustrated in FIGS. 11 and 12, three light emission areas PXA-B, PXA-G and PXA-R emitting (e.g., to emit) blue light, green light, and red light respectively are exemplarily illustrated. For example, the display device DD of an embodiment may include a blue light emission area PXA-B, a green light emission area PXA-G and a red light emission area PXA-R, which are separated from one another.

The plurality of light emitting elements ED-1, ED-2 and ED-3 may emit light in different wavelength regions. For example, in an embodiment, the display device DD may include a first light emitting element ED-1 emitting (e.g., to emit) blue light, a second light emitting element ED-2 emitting (e.g., to emit) green light, and a third light emitting element ED-3 emitting (e.g., to emit) red light. However, embodiments of the present disclosure are not limited thereto, and the first to third light emitting elements ED-1, ED-2 and ED-3 may emit light in the same wavelength region or emit light in at least one different wavelength region.

For example, the blue light emission area PXA-B, the green light emission area PXA-G, and the red light emission area PXA-R of the display device DD may correspond to the first light emitting element ED-1, the second light emitting element ED-2, and the third light emitting element ED-3, respectively.

A first emission layer EML-B of the first light emitting element ED-1 may include a first surface-modified quantum dot MQD1. The first surface-modified quantum dot MQD1 may emit blue light, which is the first light.

The second emission layer EML-G of the second light emitting element ED-2, and the third emission layer EML-R of the third light emitting element ED-3 may include a second surface-modified quantum dot MQD2 and a third surface-modified quantum dot MQD3, respectively. The second surface-modified quantum dot MQD2 and the third surface-modified quantum dot MQD3 may emit green light, which is the second light, and red light, which is the third light, respectively.

Each of the first to third surface-modified quantum dots MQD1, MQD2, and MQD3 may have a quantum dot and a head portion (of a ligand) bonded to a surface of the quantum dot. For each of the first to third surface-modified quantum dots MQD1, MQD2, and MQD3, the description of the surface-modified quantum dot MQD in the light emitting element of an embodiment described above may be equally applied.

In an embodiment, the first to third quantum dots QD1, QD2, and QD3 of the first to third surface-modified quantum dots MQD1, MQD2, and MQD3 included in the light emitting elements ED-1, ED-2, and ED-3 may be formed of different core materials. In some embodiments, the first to third quantum dots QD1, QD2, and QD3 of the first to third surface-modified quantum dots MQD1, MQD2, and MQD3 may be formed of the same core material, or two quantum dots selected from the first to third quantum dots QD1, QD2, and QD3 may be formed of the same core material, and the rest may be formed of different core materials.

In an embodiment, the first to third quantum dots QD1, QD2, and QD3 of the first to third surface-modified quantum dots MQD1, MQD2, and MQD3 may have different diameters. For example, the first quantum dot QD1 utilized in the first light emitting element ED-1 emitting light in a relatively shorter wavelength range may have a relatively smaller average diameter than the second quantum dot QD2 of the second light emitting element ED-2 and the third quantum dot QD3 of the third light emitting element ED-3, each emitting light in a relatively longer wavelength region.

In the present description, the term "average diameter" refers to the arithmetic mean of the diameters of a plurality of quantum dot particles. Also, the diameter of the quantum dot particle may be the average value of the width of the quantum dot particle in a cross section.

The relationship of the average diameters of the first to third quantum dots QD1, QD2 and QD3 is not limited to the above limitations. That is, FIG. 12 illustrates that the first to third quantum dots QD1, QD2, and QD3 are similar in size to one another. However, in another embodiment, the first to third quantum dots QD1, QD2, and QD3 included in the light emitting elements ED-1, ED-2, and ED-3 may be different in size. In addition, the average diameter of two quantum dots selected from the first to third quantum dots QD1, QD2, and QD3 may be similar, and the rest may be different.

In an embodiment, first to third ligands of the first to third surface-modified quantum dots MQD1, MQD2, and MQD3 may be the same as or different from one another. The first to third ligands may be selected accordingly based on the light emission wavelengths of the light emitting elements ED-1, ED-2, and ED-3 including the first to third surface-modified quantum dots MQD1, MQD2, and MQD3.

In the display device DD of an embodiment, as shown in FIGS. 11 and 12, the areas of each of the light emission areas PXA-B, PXA-G and PXA-R may be different from one another. In this case, the term "area" may refer to an area when viewed on a plane defined by the first direction DR1 and the second direction DR2.

The light emission areas PXA-B, PXA-G and PXA-R may have different areas according to the color emitted from the emission layers EML-B, EML-G and EML-R of the light emitting elements ED-1, ED-2 and ED-3. For example, referring to FIGS. 11 and 12, the blue light emission area PXA-B corresponding to the first light emitting element ED-1 emitting blue light may have the largest area, and the green light emission area PXA-G corresponding to the second light emitting element ED-2 generating green light may have the smallest area in the display device DD of an embodiment. However, embodiments of the present disclosure are not limited thereto, and the light emission areas PXA-B, PXA-G and PXA-R may emit light other than blue light, green light and red light, or the light emission areas PXA-B, PXA-G and PXA-R may each have the same area, or the light emission areas PXA-B, PXA-G, and PXA-R may be provided at different area ratios from those shown in FIG. 11.

Each of the light emission areas PXA-B, PXA-G and PXA-R may be an area separated by a pixel defining film (or pixel defining layer) PDL. The non-light emission areas NPXA may be areas between neighboring light emission areas PXA-B, PXA-G and PXA-R, and may correspond to the pixel defining film PDL. Meanwhile, in the present description, each of the light emission areas PXA-B, PXA-G and PXA-R may correspond to a pixel. The pixel defining film PDL may separate the light emitting elements ED-1, ED-2 and ED-3. The emission layers EML-B, EML-G and EML-R of the light emitting elements ED-1, ED-2 and ED-3 may be disposed and separated in an opening OH defined by the pixel defining film PDL.

The pixel defining film PDL may be formed of a polymer resin. For example, the pixel defining film PDL may be formed to include a polyacrylate-based resin or a polyimide-based resin. In addition, the pixel defining film PDL may be formed by further including an inorganic material in addition to the polymer resin. In some embodiments, the pixel defining film PDL may be formed to include a light absorbing material, or may be formed to include a black pigment or a black dye. The pixel defining film PDL formed including a black pigment or a black dye may implement a black pixel defining film. When forming the pixel defining film PDL, carbon black may be utilized as the black pigment or the black dye, but embodiments of the present disclosure are not limited thereto.

In some embodiments, the pixel defining film PDL may be formed of an inorganic material. For example, the pixel defining film PDL may be formed to include a material selected from silicon nitride (SiNx), silicon oxide (SiOx), silicon oxide (SiOxNy), etc. The pixel defining film PDL may define light emission areas PXA-B, PXA-G, and PXA-R. The light emission areas PXA-B, PXA-G, and PXA-R, and a non-light emission area NPXA may be separated by the pixel defining film PDL.

Each of the light emitting elements ED-1, ED-2 and ED-3 may include a first electrode EL1, a hole transport region HTR, one or more of emission layers EML-B, EML-G and EML-R, an electron transport region ETR, and a second electrode EL2. The description in connection with FIG. 4 may be equally applied to the first electrode EL1, the hole transport region HTR, the electron transport region ETR, and the second electrode EL2, except that the first to third surface-modified quantum dots MQD1, MQD2, and MQD3 included in the emission layers EML-B, EML-G, and EML-R are different from one another in the light emitting elements ED-1, ED-2, and ED-3 included in the display device DD of an embodiment. In some embodiments, each of the light emitting elements ED-1, ED-2, and ED-3 may further include a capping layer between the second electrode EL2 and the encapsulation layer TFE.

An encapsulation layer TFE may cover the light emitting elements ED-1, ED-2 and ED-3. The encapsulation layer TFE may be a single layer or a laminated layer including a plurality of layers. The encapsulation layer TFE may be a thin film encapsulation layer. The encapsulation layer TFE protects the light emitting elements ED-1, ED-2 and ED-3. The encapsulation layer TFE may cover an upper surface of the second electrode EL2 disposed in the opening OH, and may fill the opening OH.

In FIG. 12, the hole transport region HTR and the electron transport region ETR are illustrated as a common layer covering the pixel defining film PDL, but embodiments of the present disclosure are not limited thereto. In an embodiment, the hole transport region HTR and the electron transport region ETR may be disposed in (e.g., only in) the opening OH defined by the pixel defining film PDL.

For example, when the hole transport region HTR and the electron transport region ETR in addition to the emission layers EML-B, EML-G, and EML-R are provided through an inkjet printing method, the hole transport region HTR, the emission layers EML-B, EML-G, and EML-R, the electron transport region ETR, etc., may be provided corresponding to the opening OH defined between the pixel defining layer PDL. However, embodiments of the present disclosure are not limited thereto, and as shown in FIG. 13, the hole transport region HTR and the electron transport region ETR may cover the pixel defining layer PDL without being patterned, and may be provided as one common layer regardless of a method of providing each functional layer.

In the display device DD of an embodiment illustrated in FIG. 12, although the thicknesses of the emission layers EML-B, EML-G, and EML-R of the first to third light emitting elements ED-1, ED-2, and ED-3 are illustrated to be similar to one another, embodiments of the present disclosure are not limited thereto. For example, in an embodiment, the thicknesses of the emission layers EML-B, EML-G, and EML-R of the first to third light emitting elements ED-1, ED-2, and ED-3 may be different from one another.

Referring to FIG. 11, the blue light emission areas PXA-B and the red light emission areas PXA-R may be alternately arranged in the first direction DR1 to form a first group PXG1. The green light emission areas PXA-G may be arranged in the first direction DR1 to form a second group PXG2.

The first group PXG1 and the second group PXG2 may be spaced apart in the second direction DR2. Each of the first group PXG1 and the second group PXG2 may be provided in plural. The first groups PXG1 and the second groups PXG2 may be alternately arranged in the second direction DR2.

One green light emission area PXA-G may be disposed spaced apart from one blue light emission area PXA-B or one red light emission area PXA-R in the fourth direction DR4. The fourth direction DR4 may be a direction between the first direction DR1 and the second direction DR2.

The arrangement structure of the light emission areas PXA-B, PXA-G and PXA-R shown in FIG. 11 may have a PenTile®/PENTILE® structure or pattern (PENTILE® is a registered trademark owned by Samsung Display Co., Ltd.). However, the arrangement structure of the light emission areas PXA-B, PXA-G and PXA-R in the display device DD according to embodiments is not limited to the arrangement structure shown in FIG. 11. For example, in an embodiment, the light emission areas PXA-B, PXA-G and PXA-R may have a stripe structure in which the blue light emission area PXA-B, the green light emission area PXA-G, and the red light emission area PXA-R may be alternately arranged along the first direction DR1.

Referring to FIG. 12, the display device DD of an embodiment further includes a light control layer PP. The light control layer PP may block external light incident to the display panel DP from outside the display device DD. The light control layer PP may block a part of the external light. The light control layer PP may perform a reflection reduction or prevention function to reduce or minimize reflection due to the external light.

In an embodiment illustrated in FIG. 12, the light control layer PP may include a color filter layer CFL. That is, the display device DD of an embodiment may further include the color filter layer CFL disposed on the light emitting elements ED-1, ED-2, and ED-3 of the display panel DP.

In the display device DD of an embodiment, the light control layer PP may include a base layer BL and a color filter layer CFL.

The base layer BL may be a member providing a base surface on which the color filter layer CFL is disposed. The base layer BL may be a glass substrate, a metal substrate, a plastic substrate, etc. However, embodiments of the present disclosure are not limited thereto, and the base layer BL may be an inorganic layer, an organic layer, or a composite material layer.

The color filter layer CFL may include a light blocking unit BM and a color filter CF. The color filter may include a plurality of filters CF-B, CF-G, and CF-R. That is, the color filter layer CFL may include a first filter CF-B to transmit a first color light, a second filter CF-G to transmit a second color light, and a third filter CF-R to transmit a third color light. For example, the first filter CF-B may be a blue filter (e.g., a blue light filter), the second filter CF-G may be a green filter (e.g., a green light filter), and the third filter CF-R may be a red filter (e.g., a red light filter).

Each of the filters CF-B, CF-G, and CF-R may include a polymer photosensitive resin and a pigment and/or a dye. The first filter CF-B may include a blue pigment and/or a blue dye, the second filter CF-G may include a green pigment and/or a green dye, and the third filter CF-R may include a red pigment and/or a red dye.

However, embodiments of the present disclosure are not limited thereto, and the first filter CF-B may not include any pigment or dye. The first filter CF-B may include a polymer photosensitive resin, but may not include a pigment or a dye. The first filter CF-B may be transparent. The first filter CF-B may be formed of a transparent photosensitive resin.

The light blocking unit BM may be a black matrix. The light blocking unit BM may be formed to include an organic light blocking material and/or an inorganic light blocking material, each including a black pigment and/or a black dye. The light blocking unit BM may reduce or prevent light leakage, and separate boundaries between the adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic material layer including at least one inorganic material selected from silicon nitride, silicon oxide, and silicon oxynitride. The buffer layer BFL may be formed of a single layer or a plurality of layers.

In an embodiment shown in FIG. 12, the first color filter CF-B of the color filter layer CFL is illustrated to overlap the second filter CF-G and the third filter CF-R, but embodiments of the present disclosure are not limited thereto. For example, the first to third filters CF-B, CF-G and CF-R may be separated by the light blocking unit BM and may not overlap one another. In some embodiments, each of the first to third filters CF-B, CF-G and CF-R may be disposed correspondingly to each of the blue light emission area PXA-B, green light emission area PXA-G, and red light emission area PXA-R.

Unlike shown in FIG. 12 and/or the like, the display device DD of an embodiment may include a polarizing layer as a light control layer PP instead of the color filter layer CFL. The polarizing layer may block external light provided to the display panel DP from the outside. The polarizing layer may block a part of the external light.

In addition, the polarizing layer may reduce reflected light generated in the display panel DP by the external light. For example, the polarizing layer may function to block reflected light of a case where light provided from outside the display device DD is incident to the display panel DP and exits again. The polarizing layer may be a circularly polarizer having a reflection reduction or prevention function or the polarizing layer may include a linear polarizer and a λ/4 phase retarder. In some embodiments, the polarizing layer may be disposed on the base layer BL to be exposed or the polarizing layer may be disposed under the base layer BL.

FIG. 13 is a cross-sectional view of a display device DD-1 of another embodiment of the present disclosure. In the description of the display device DD-1 according to an embodiment, content overlapping with the one described above with reference to FIGS. 1 to 12 will not be described again, and only the differences will be mainly described.

Referring to FIG. 13, the display device DD-1 of an embodiment may include a light conversion layer CCL disposed on a display panel DP-1. In some embodiments, the display device DD-1 may further include a color filter layer CFL. The color filter layer CFL may be disposed between the base layer BL and the light conversion layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL provided on the base substrate BS, and a display element layer DP-EL1.

The display element layer DP-EL1 includes a light emitting element ED-a, and the light emitting element ED-a may include a first electrode EL1 and a second electrode EL2 facing each other, and a plurality of layers OL disposed between the first electrode EL1 and the second electrode EL2. The plurality of layers OL may include a hole transport region HTR (FIG. 4), an emission layer EML (FIG. 4), and an electron transport region ETR (FIG. 4). An encapsulation layer TFE may be disposed on the light emitting element ED-a.

In the light emitting element ED-a, the same content as the one described with reference to FIG. 4 may be applied to the first electrode EL1, the hole transport region HTR, the electron transport region ETR, and the second electrode EL2. However, in the light emitting element ED-a included in the display panel DP-1 of an embodiment, the emission layer may include a host and a dopant which are organic electroluminescent materials or may include the surface-modified quantum dot described with reference to FIGS. 1 to 12. In the display panel DP-1 of an embodiment, the light emitting element ED-a may emit blue light.

The light conversion layer CCL may include a plurality of partition walls BK disposed spaced apart from each other and light control units CCP-B, CCP-G and CCP-R disposed between the partition walls BK. The partition walls BK may be formed from a composition including a polymer resin and a coloring additive. The partition walls BK may be formed to include a light absorbing material, or formed to include a pigment and/or a dye. For example, the partition walls BK may include a black pigment or a black dye to implement a black partition wall. When forming the black partition wall, carbon black and/or the like may be utilized as the black pigment and/or the black dye, but embodiments of the present disclosure are not limited thereto.

The light conversion layer CCL may include a first light control unit CCP-B to transmit the first light, a second light control unit CCP-G including a fourth surface-modified quantum dot MQD2-$a$ to convert the first light to the second light, and a third light control unit CCP-R including a fifth surface-modified quantum dot MQD3-$a$ to convert the first light to the third light. The second light may be light of a longer wavelength region than the first light, and the third light may be light of a longer wavelength region than the first light and the second light. For example, the first light may be blue light, the second light may be green light, and the third light may be red light. Regarding surface-modified quantum dots MQD2-a and MQD3-a included in the light control units CCP-G and CCP-R, the same content as the one for the surface-modified quantum dots utilized in the emission layer illustrated in FIG. 12 may be applied.

The light conversion layer CCL may further include a capping layer CPL. The capping layer CPL may be disposed on the light control units CCP-B, CCP-G and CCP-R, and the partition walls BK. The capping layer CPL may serve to reduce or prevent penetration of moisture and/or oxygen (hereinafter, referred to as "moisture/oxygen"). The capping layer may be disposed on the light control units CCP-B, CCP-G and CCP-R to reduce or prevent the light control units CCP-B, CCP-G and CCP-R from being exposed to moisture/oxygen. The capping layer CPL may include at least one inorganic layer.

The display device DD-1 of an embodiment may include a color filter layer CFL disposed on the light conversion layer CCL, and the descriptions of FIG. 12 may be equally applied to the color filter layer CFL and the base layer BL.

A quantum dot composition of an embodiment may be utilized as an emission layer material capable of exhibiting improved luminous efficiency properties by binding a ligand that may be removed to a surface of a quantum dot to reduce or prevent degradation of electron injection properties even when applied to an emission layer.

A light emitting element and a display device of an embodiment includes a quantum dot in the emission layer and may exhibit improved luminous efficiency and service life without degradation of electron injection properties.

The use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

Although the present disclosure has been described with reference to example embodiments of the present disclosure, it will be understood that the present disclosure should not be limited to these embodiments but various changes and modifications can be made by those skilled in the art without departing from the spirit and scope of the present disclosure. Accordingly, the technical scope of the present disclosure is not intended to be limited to the contents set forth in the detailed description of the specification, but is intended to be defined by the appended claims, and equivalents thereof.

What is claimed is:

1. A quantum dot composition comprising:
    a quantum dot having a surface to which a ligand is bonded; and
    a thermal decomposition auxiliary compound,
    wherein the thermal decomposition auxiliary compound is an azo compound.

2. The quantum dot composition of claim 1, wherein the ligand comprises:
    a head portion bonded to the surface of the quantum dot; and
    a tail portion comprising at least one radical reactive group.

3. The quantum dot composition of claim 2, wherein the radical reactive group is a carbonyl group, an ester group, an ether group, a peroxy group, an azo group, a carbamate group, a thiocarbamate group, a carbonate group, or a xanthate group.

4. The quantum dot composition of claim 1, wherein the ligand is a monodentate ligand or a bidentate ligand.

5. The quantum dot composition of claim 2, wherein the head portion comprises a thiol group, a hydroxyl group, a phosphine group, a fluorenyl group, an amine group, or a carboxylic acid group.

6. The quantum dot composition of claim 5, wherein the head portion further comprises an alkyl group having 1 to 6 carbon atoms.

7. The quantum dot composition of claim 2, wherein the tail portion is represented by any one selected from Formulas 1 to 6:

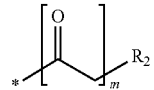

Formula 1

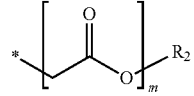

Formula 2

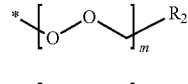

Formula 3

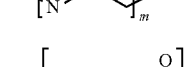

Formula 4

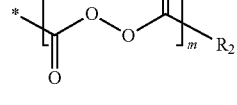

Formula 5

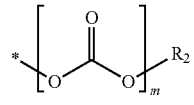

Formula 6 wherein in Formulas 1 to 6,
    $R_2$ is an alkyl group having 2 to 20 carbon atoms, and
    m is an integer of 1 to 5.

8. The quantum dot composition of claim 1, wherein the azo compound is represented by Formula 7:

$$R_a-N=N-R_b, \text{ and} \quad \text{Formula 7}$$

wherein in Formula 7,
  $R_a$ and $R_b$ are each independently an alkyl group having 2 to 20 carbon atoms.

9. The quantum dot composition of claim 1, wherein the quantum dot having the ligand bonded to the surface thereof is about 0.5 wt % to about 10 wt % in amount with respect to a total amount of the quantum dot composition.

10. The quantum dot composition of claim 1, wherein the thermal decomposition auxiliary compound is about 0.01 wt % to about 1 wt % in amount with respect to a total amount of the quantum dot composition.

11. The quantum dot composition of claim 1,
  wherein the quantum dot composition further comprises an organic solvent, and
  wherein the quantum dot is dispersed in the organic solvent.

12. The quantum dot composition of claim 1, wherein the quantum dot is a semiconductor nanocrystal comprising a core and a shell surrounding the core.

\* \* \* \* \*